(12) United States Patent
Toh et al.

(10) Patent No.: US 8,703,534 B2
(45) Date of Patent: Apr. 22, 2014

(54) SEMICONDUCTOR PACKAGES AND METHODS OF PACKAGING SEMICONDUCTOR DEVICES

(75) Inventors: Chin Hock Toh, Singapore (SG); Kriangsak Sae Le, Johor (MY)

(73) Assignee: United Test and Assembly Center Ltd., Singapore (SG)

(*) Notice: Subject to any disclaimer, the term of this patent is extended or adjusted under 35 U.S.C. 154(b) by 130 days.

(21) Appl. No.: 13/360,796

(22) Filed: Jan. 29, 2012

(65) Prior Publication Data

US 2012/0193812 A1    Aug. 2, 2012

Related U.S. Application Data

(60) Provisional application No. 61/437,685, filed on Jan. 30, 2011.

(51) Int. Cl.
  *H01L 21/44* (2006.01)
  *H01L 21/48* (2006.01)
  *H01L 21/50* (2006.01)

(52) U.S. Cl.
  USPC ........... 438/106; 438/108; 438/127; 438/311; 257/E21.077; 257/E21.32; 257/E21.499; 257/E21.502; 257/E21.503; 257/E21.511

(58) Field of Classification Search
  USPC ......... 438/106, 107, 108, 112, 126, 127, 311; 257/686, 698, 777, E21.077, E21.32, 257/E21.499, E21.502, E21.508, E21.511
  See application file for complete search history.

(56) References Cited

U.S. PATENT DOCUMENTS

| | | | |
|---|---|---|---|
| 5,672,548 A * | 9/1997 | Culnane et al. | 438/118 |
| 6,097,098 A * | 8/2000 | Ball | 257/786 |
| 6,573,609 B2 * | 6/2003 | Fjelstad et al. | 257/778 |
| 7,443,030 B2 * | 10/2008 | Muthukumar et al. | 257/758 |
| 7,772,858 B2 * | 8/2010 | Sasaki et al. | 324/756.03 |
| 8,115,292 B2 * | 2/2012 | Toh et al. | 257/686 |

* cited by examiner

*Primary Examiner* — David Nhu
(74) *Attorney, Agent, or Firm* — Horizon IP Pte Ltd

(57) ABSTRACT

A method of forming semiconductor assemblies is disclosed. The method includes providing an interposer with through interposer vias. The interposer includes a first surface and a second surface. The through interposer vias extend from the first surface to the second surface of the interposer. A first die is mounted on the first surface of the interposer. The first die comprises a first surface with first conductive contacts thereon. The interposer comprises material with coefficient of thermal expansion (CTE) similar to that of the first die. The first conductive contacts of the first die are coupled to the through interposer vias on the first surface of the interposer.

20 Claims, 27 Drawing Sheets

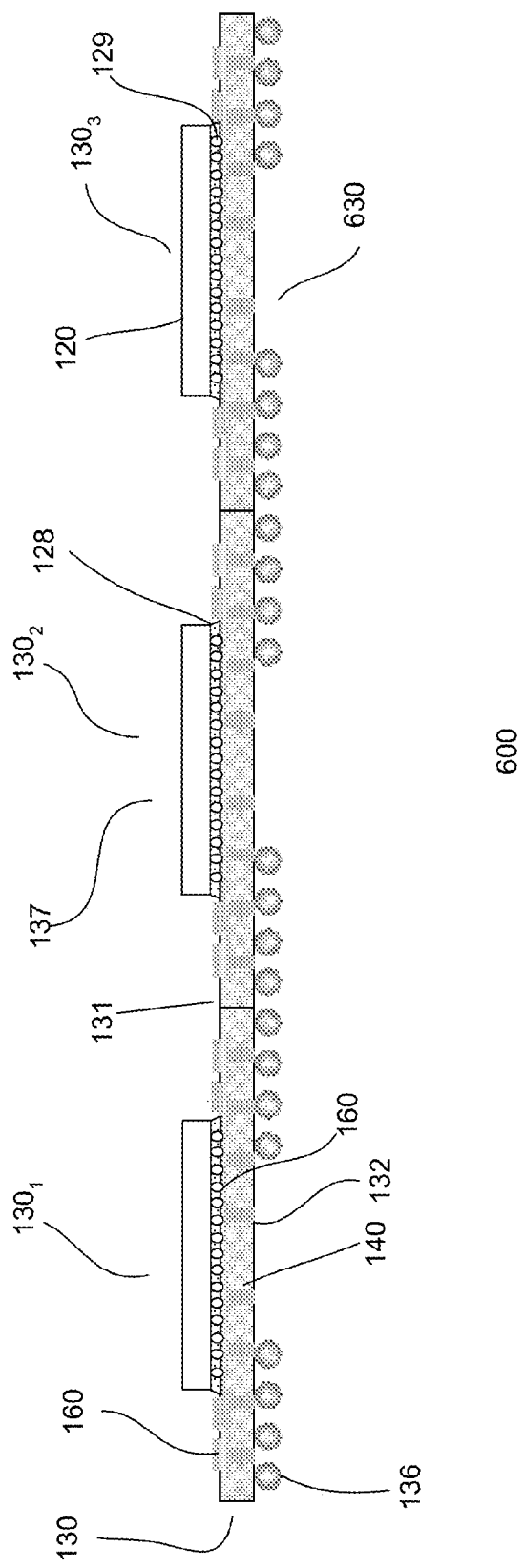

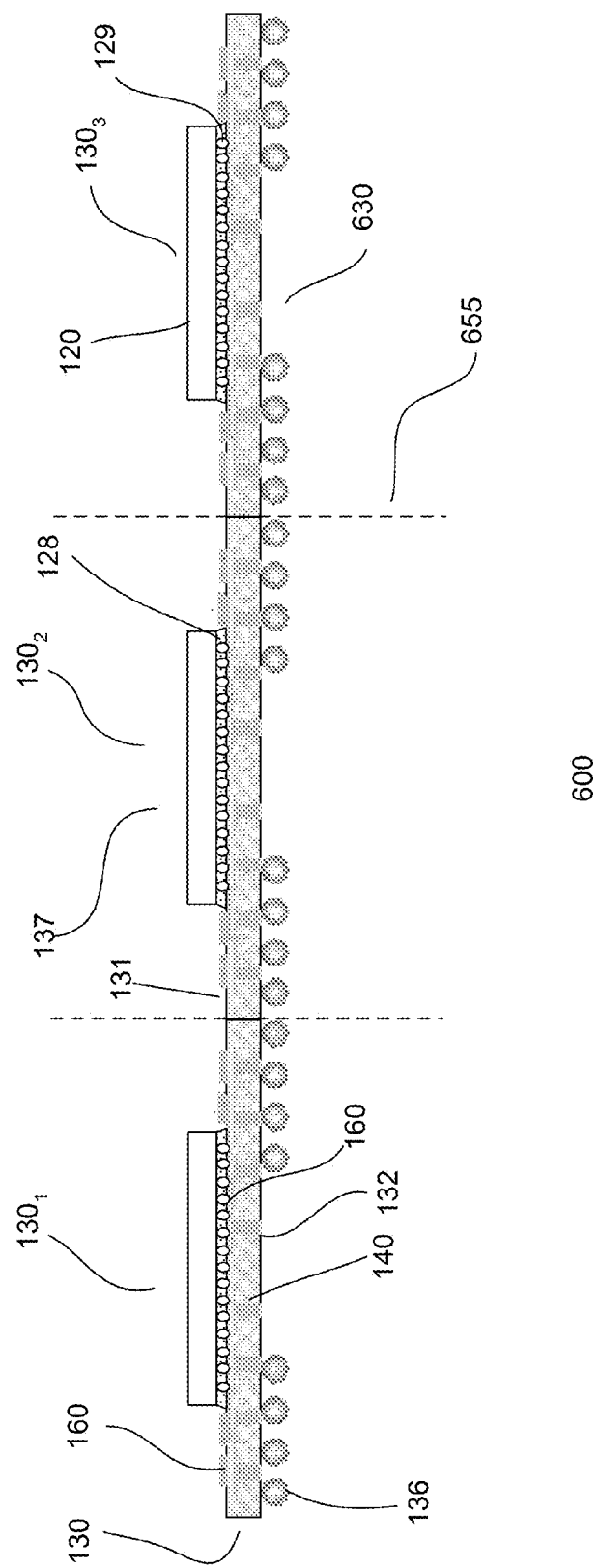

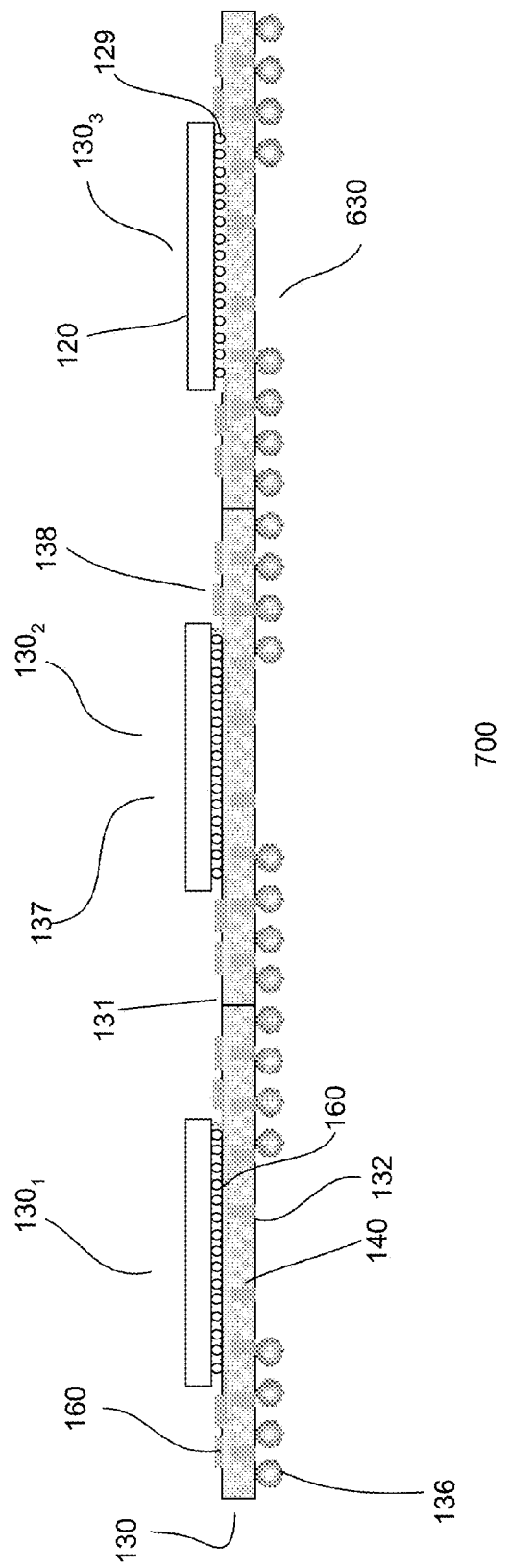

SEMICONDUCTOR PACKAGES AND METHODS OF PACKAGING SEMICONDUCTOR DEVICES

CROSS-REFERENCE TO RELATED APPLICATIONS

The application claims priority of U.S. Provisional Application No. 61/437,685 entitled "Stacked Packages with Through Silicon Interposer" filed on Jan. 30, 2011, which is herein incorporated by reference for all purposes.

BACKGROUND

Package-on-packages (PoP) are particularly useful, for example, in the PDA/mobile phone devices where small packaging size is an important factor. Existing Package-on-package (PoP) structures stack a top laminate-based package onto another laminated substrate or laminate-based substrate. The conventional PoP structure suffers from several disadvantages. For example, the mismatch of coefficient of thermal expansions (CTEs) between the laminated substrate and die causes problems like warpage of the packages which affects robustness of the package. In addition, the additional substrate incurs extra cost.

From the foregoing discussion, there is a desire to provide an improved package.

SUMMARY

A method of forming semiconductor assemblies is disclosed. The method includes providing an interposer with through interposer vias. The interposer includes a first surface and a second surface. The through interposer vias extend from the first surface to the second surface of the interposer. A first die is mounted on the first surface of the interposer. The first die comprises a first surface with first conductive contacts thereon. The interposer comprises material with coefficient of thermal expansion (CTE) similar to that of the first die. The first conductive contacts of the first die are coupled to the through interposer vias on the first surface of the interposer.

In another embodiment, a method of forming semiconductor assemblies is presented. The method includes providing an interposer with through interposer vias. The interposer comprises a first surface and a second surface. The first and second surfaces of the interposer comprise interposer contact pads thereon. The through interposer vias facilitate electrical coupling between the interposer contact pads on the first and second surfaces of the interposer. The through interposer vias extend from the first surface to the second surface of the interposer. The method also includes mounting a first die on a first die attach region on the first surface of the interposer. The first die comprises a first surface with first conductive contacts thereon. The interposer comprises material with CTE similar to that of the first die. The first conductive contacts of the first die are coupled to the through interposer vias on the first surface of the interposer.

In yet another embodiment, a semiconductor assembly is disclosed. The assembly comprises an interposer with through interposer vias. The interposer comprises a first surface and a second surface. The through interposer vias extend from the first surface to the second surface of the interposer. The assembly also includes a first die on a first die attach region on the first surface of the interposer, the first die comprises a first surface with first conductive contacts thereon. The interposer comprises material with CTE similar to that of the first die. The first conductive contacts of the first die are coupled to the through interposer vias on the first surface of the interposer.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 6a-6d show a process of forming a semiconductor package;

FIGS. 7a-7d show another embodiment of a method for forming a semiconductor;

DETAILED DESCRIPTION

Embodiments relate to semiconductor packages. The packages are used to package one or more semiconductor dies. For the case of more than one die, the dies may be arranged in a planar arrangement, vertical arrangement, or a combination thereof. The dies, for example, may include memory devices, logic devices, communication devices, optoelectronic devices, digital signal processors (DSPs), microcontrollers, system-on-chips (SOCs) as well as other types of devices or a combination thereof. Such packages may be incorporated into electronic products or equipments, such as phones, computers as well as mobile and mobile smart products. Incorporating the packages into other types of products may also be useful.

Figure 1A:
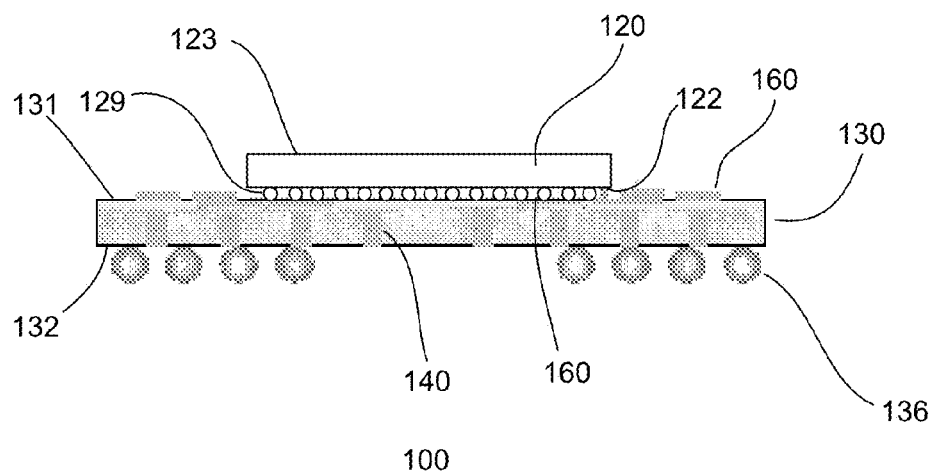
FIGS. 1a-1b show embodiments of semiconductor packages.
Figure 1B:
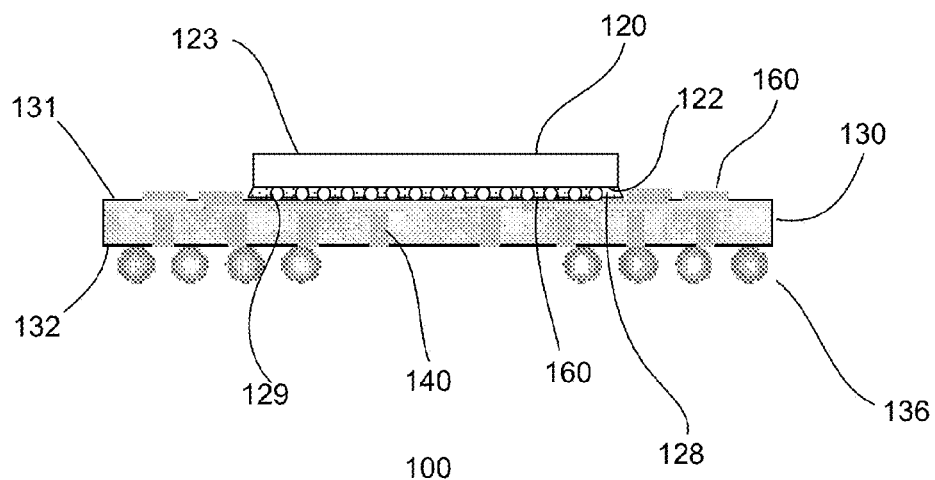

FIGS. 1a-1b show embodiments of a semiconductor assembly 100. The assembly, in one embodiment, includes an interposer 130 having first and second major surfaces 131 and 132. The first major surface, for example, may be referred to as the "top surface" and the second major surface, for example, may be referred to as the "bottom surface". Other designations for the surfaces may also be useful. In one embodiment, the top surface includes a die attach region on which a die is attached.

The top and bottom surfaces of the interposer are provided with interposer contact pads 160, including solder lands for example. The interposer contact pads may be formed of a suitable material, including Ni, Cu, Au, Pd, Al or a combination thereof. The contact pads may be covered with surface finishes, such as Cu—OSP, Ni—Au, alloys or conductive polymers. Additional external interposer contacts 136 may be disposed onto the contact pads and may be in the form of spherical shaped structures, balls or elongated structures. The external interposer contacts, may be formed from a conductive material. For example, the contacts may be formed from solders, such as lead-based or non lead-based solders. Other non-solder based conductive materials may also be used. The external interposer contacts can be arranged in any suitable manner, including a regular ball grid array pattern. Arranging the contacts in other patterns such as a non-regular pattern or providing other types of contacts are also useful.

The interposer 130 includes through interposer vias 140 extending from the top surface to the bottom surface of the interposer. The through interposer vias may be filled with a conductive material. The conductive material, for example, may be copper or other materials of appropriate conductivity. In another embodiment, the through interposer vias may be partially filled with a conductive material and partially filled with a non-conductive or low conductivity material. The non-conductive or low-conductivity material may be, for example, poly silicon or polymer fill material. The through interposer vias provide electrical coupling between the top and bottom interposer contact pads.

Conductive traces may be provided on the top and bottom surfaces of the interposer to allow for re-routing of the top interposer contact pads and bottom interposer contact pads to achieve a desired pattern arrangement. The top and bottom interposer contact pads may be coupled through the conductive traces and the interposer interconnects. The conductive traces of a surface may be insulated from each other by a dielectric material.

A die 120 is mounted to a die attach region defined on the top surface of the interposer. The die, for example, is a singulated die of a wafer processed with a plurality of dies in parallel. The die has first and second major surfaces. One of the surfaces may be an active surface 122 with die contacts 129 while the other surface may be an inactive surface 123.

In one embodiment, the die is a flip chip. The active side of the die may be provided with contact structures, such as contact bumps or pillars. Contact structures of other geometry may also be useful. The contact structures may be formed of solder or other types of conductive materials. The contact structures may be arranged in various layout designs, for example, in a regular grid array arrangement. Other contact structure patterns may also be used. For example, the die contacts may be arranged in one or more rows disposed at about the center of the die or rows at the sides of the die or in a non-regular array.

In the case of a flip chip, the top interposer contact pads for connecting to the flip chip are disposed in the die attach region of the interposer. The pattern of the top interposer contact pads is configured to match the pattern of the flip chip contacts. For example, the flip chip contacts are mated to the interposer contact pads. The bottom interposer contact pads are coupled to the flip chip contacts, for example, by the through interposer vias.

As shown, the mating of the flip chip to the interposer leaves a space between the active surface of the flip chip and top interposer surface. In one embodiment, the space may be left unfilled, as shown in FIG. 1a. In other embodiments, an underfill 128 is provided in the space between the active surface of the die and top interposer surface, as shown in FIG. 1b. The under fill material, for example, may be an epoxy-based polymeric material.

The interposer, in one embodiment, is formed of a semiconductor material having a CTE which is the same or similar to the die. For example, the difference between the interposer and die CTE values is less than or equal to 3 ppm/° C. In one embodiment, the interposer may be formed of silicon material. The interposer may be a singulated interposer. For example, the interposer may be formed on a wafer having a plurality of interposers. The wafer is diced to singulate the interposers. The interposer may, serve as a base for the semiconductor assembly 100.

Figure 2A:
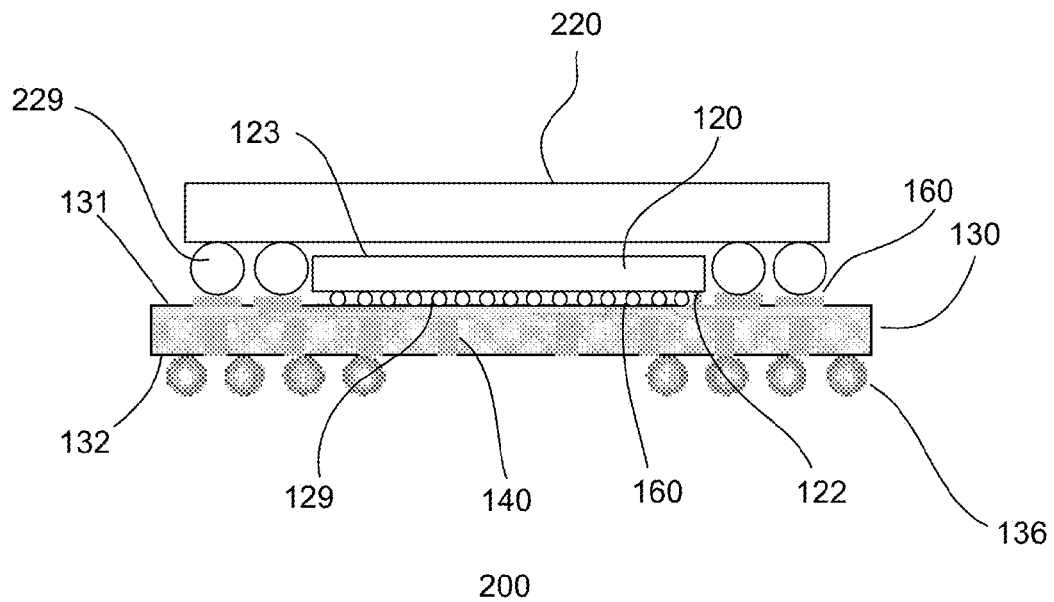
FIGS. 2a-2c show other embodiments of semiconductor packages.
Figure 2B:
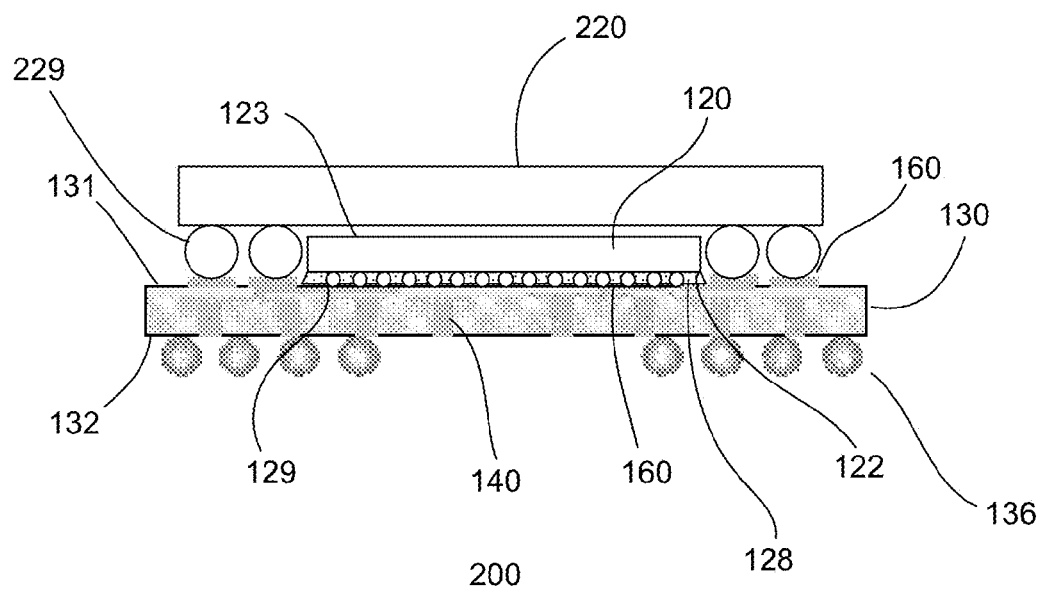
Figure 2C:
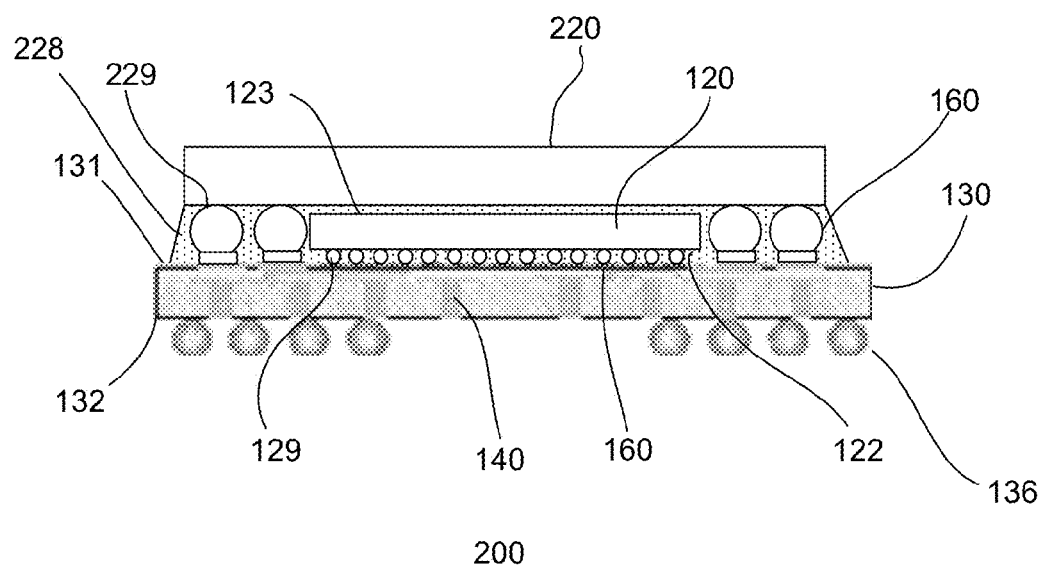

FIGS. 2a-2c show other embodiments of a semiconductor assembly 200. The assembly 200 comprises of a semiconductor assembly 100 and a second die 220. The semiconductor assembly 100 is similar to that described in FIGS. 1a-1b. As such, common features will not be further described in detail.

In one embodiment, a second die 220 is provided on the top surface of interposer 130 to form a Package-on-Package (PoP). It is understood that the first and second dies need not be of the same type or material. The second die is disposed above the first die and attached to the top interposer surface. The second die, for example, is a flip chip having second die contacts 229 on an active surface. As shown, the lateral dimensions of the second die are larger than that of the first die. The second die contacts, for example, are arranged in the periphery of the active surface of the second die to provide a space to accommodate the first die below. The second die contacts are coupled to top interposer contacts in the second die attach region. The second die attach region, for example, is located at the periphery of the first die attach region.

As shown in FIG. 2a, no underfill is provided in the space between the first die and top interposer surface. In another embodiment, as shown in FIG. 2b, an underfill 128 is provided in the space between the active surface of the first die and top interposer surface, while no underfill is provided between the first and second dies as well as the second die and the top interposer surface. Alternatively, as shown in FIG. 2c, an underfill 228 is provided between the dies and interposer top surface. The under fill material, for example, may be an epoxy-based polymeric material.

Figure 3A:
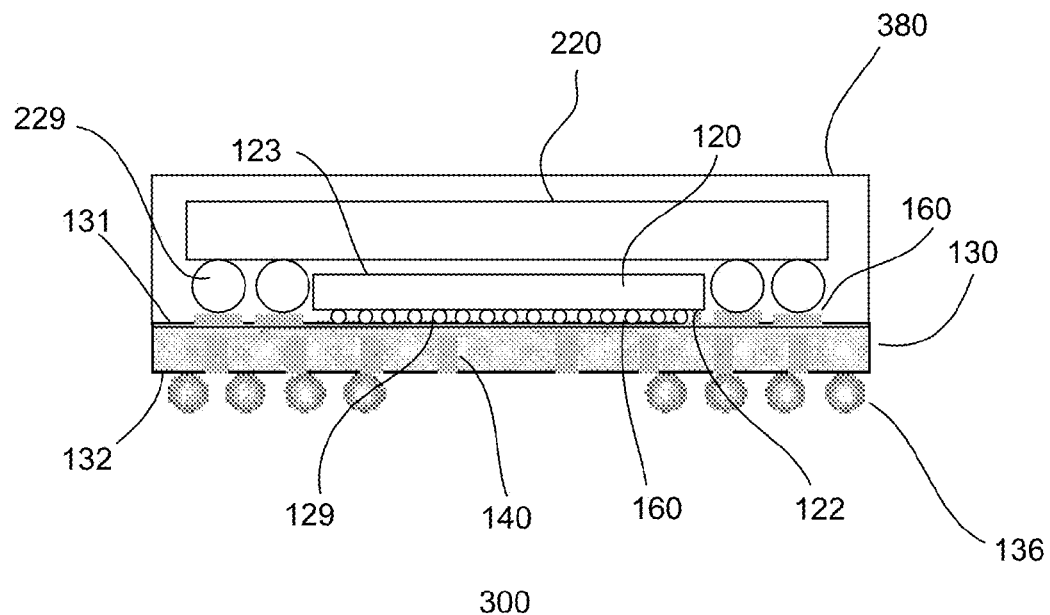
FIGS. 3a-3c show yet other embodiments of semiconductor packages.
Figure 3B:
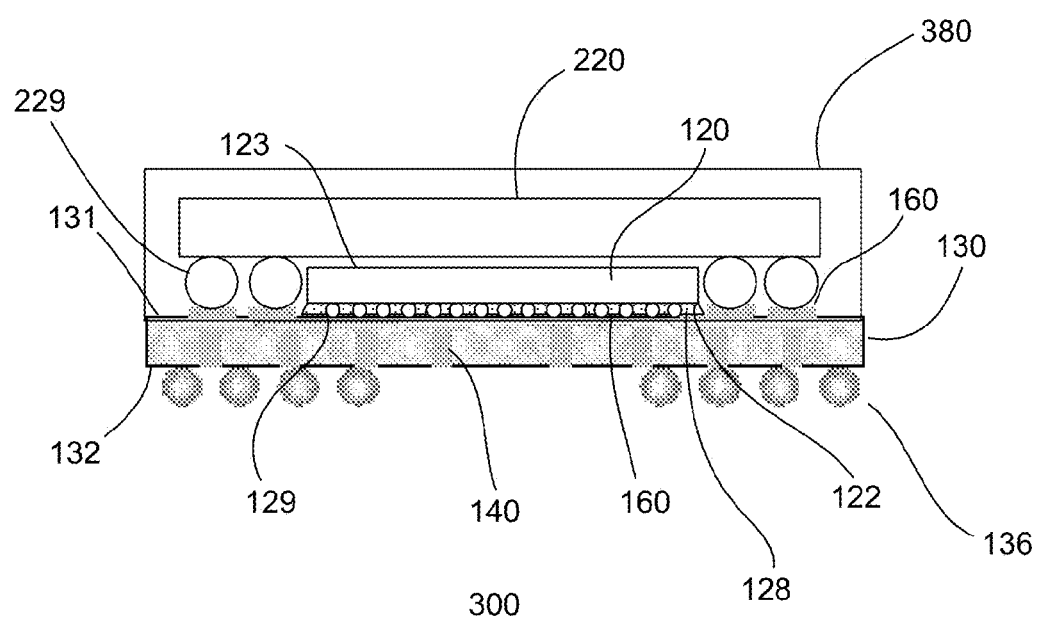
Figure 3C:
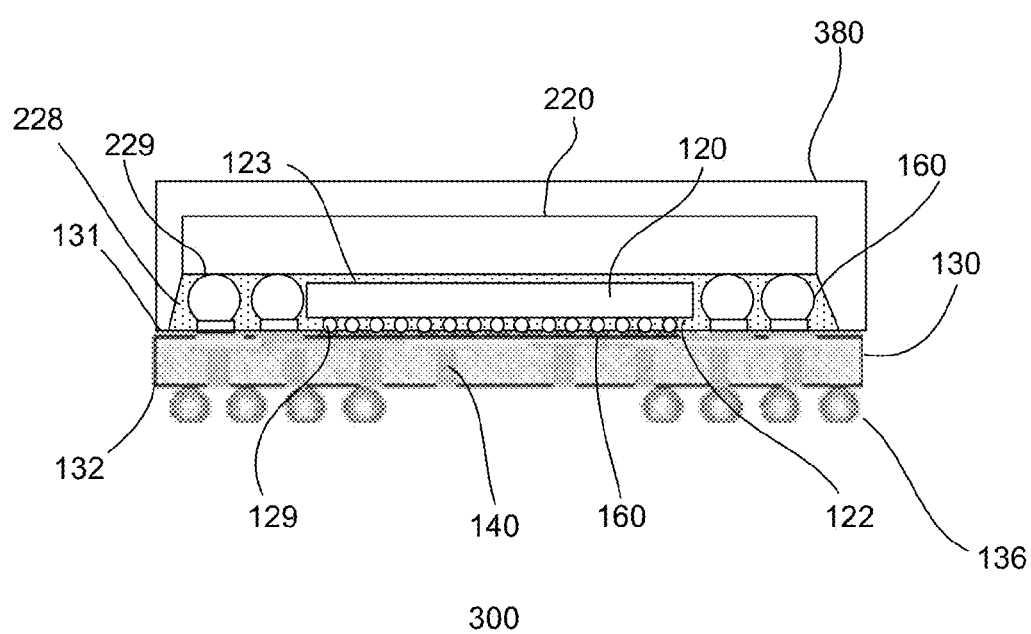

FIGS. 3a-3c show other embodiments of a semiconductor assembly 300. The assembly 300 is similar to the assembly 200 described in FIGS. 2a-2c. As such, common features may not be described or described in detail.

Referring to FIGS. 3a-3c, the assembly 300 includes an encapsulant 380 which encapsulates the dies. For example, the encapsulant material may be an epoxy resin, silicone, or plastic. Other types of encapsulants may also be useful. For example, the encapsulant may be a molding compound. The encapsulant provides protection against the environment. As shown, the encapsulant covers the top of the second die. In other embodiments, the encapsulant may have a coplanar top surface with the surface of top die (not shown). For example, the inactive surface of the top die is exposed. The interposer may, for example, serve as a base for the stacked interposer package.

Figure 4A:
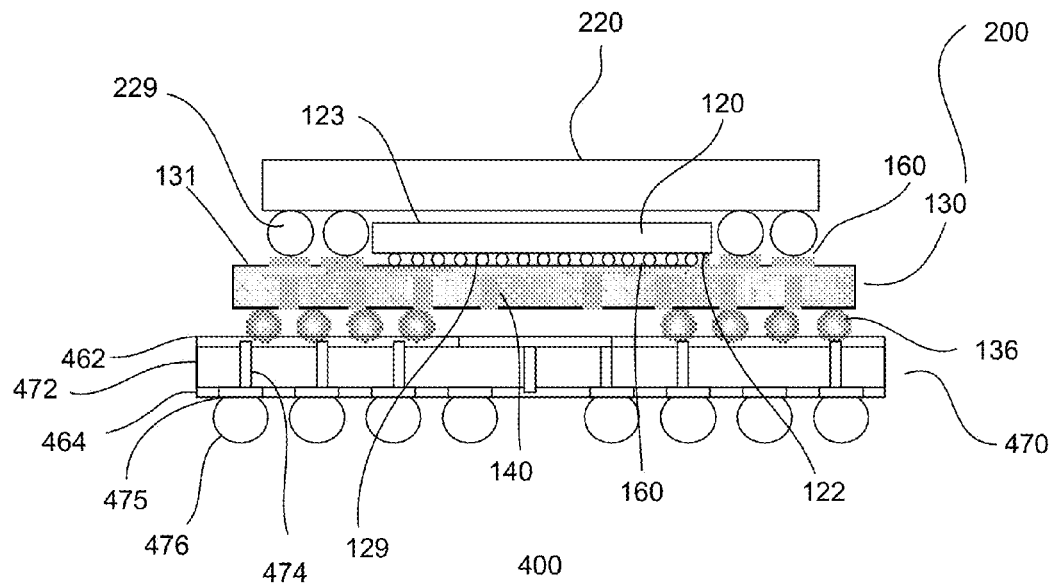
FIGS. 4a-4c show various other embodiments of semiconductor packages.
Figure 4B:
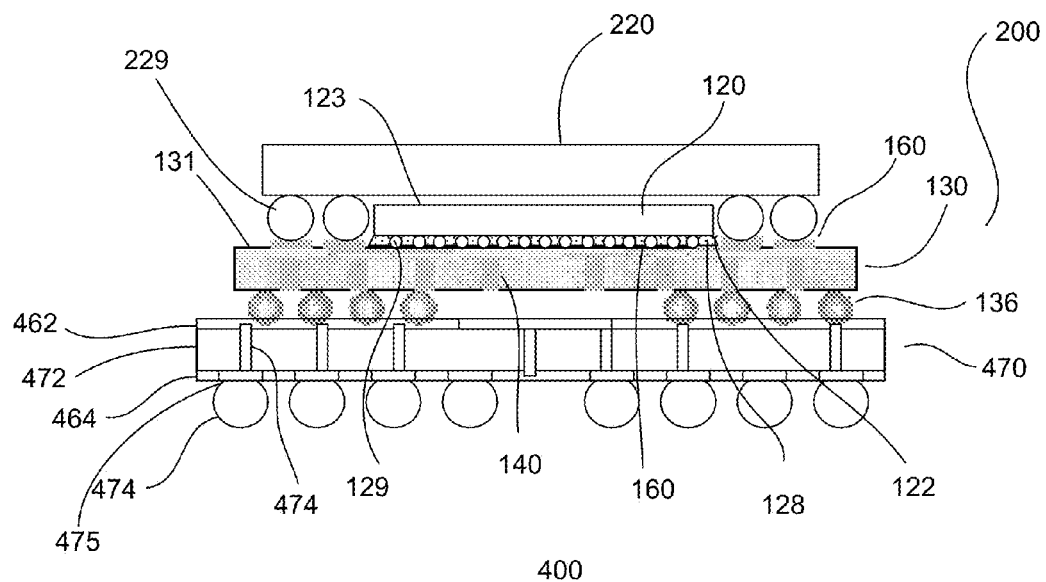
Figure 4C:
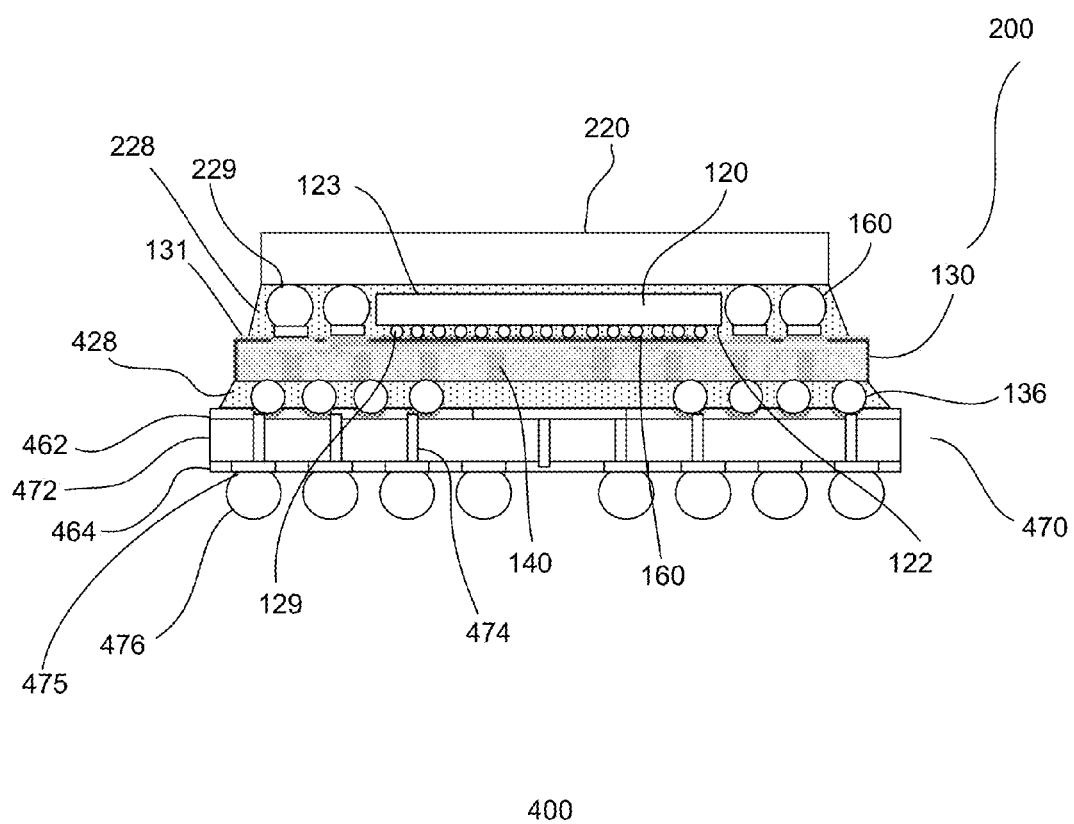

FIGS. 4a-4c show other embodiments of a package 400. As shown, the package 400 comprises of a semiconductor assembly and a package substrate. The semiconductor assembly is similar to that described in FIGS. 2a-2c. As such, common features will not be described in detail.

In one embodiment, package 400 comprises of a semiconductor assembly 200 mounted on top of package substrate 470. Referring to FIGS. 4a-4c, the semiconductor assembly 200 is provided on top of package substrate 470. The package substrate serves as a base of the package. The package substrate may be of any suitable geometry, for example, it may be in a rectangular shape to form a rectangular shaped package. The package substrate includes a substrate layer 472 with first and second major surfaces. The first surface, for example, is the top surface on which the interposer package is mounted while the second surface is the bottom surface. Other designation of surfaces may also be useful. The package substrate surface may further be provided with dielectric layers 462 and 464. The package substrate can be any type of substrates suitable for assembling of integrated circuit (IC) packages. In one embodiment, the package substrate may be single-layered. In another embodiment, multi-layered substrates may be used. The different layers can be laminated or built-up. The package substrate can comprise various types of materials, including organic material, such as Bismaleimide Triazine (BT) or polyimide. Other types of materials can also be employed for the package substrate. For example, the package substrate is a multi-layer laminated substrate.

As shown, bottom substrate contact pads 475 are provided on the bottom surface of the package substrate. The bottom substrate contact pads serve as external package connections. For example, the bottom substrate contact pads can be electrically coupled to an external device (not shown), such as a circuit board through external substrate contacts 476. The external substrate contacts 476 may be formed from conductive material and comprise spherical shaped structures or balls. Preferably, the external substrate contacts comprise a reflowable conductive material. For example, the external substrate contacts may comprise of solder material, including lead-based, non lead-based alloys. Conductive polymers may also be used.

On the top surface of the package substrate are disposed top substrate contact pads. The top substrate contact pads comprise a top package substrate pad pattern. The top substrate contact pads, for example, are arranged in a manner that would correspond to the pattern of interposer contacts 136 of the interposer package. The top substrate contact pads, as shown, are disposed on a package substrate chip region on the top surface of the package substrate. The top substrate contact pads are coupled to the bottom substrate contact pads by, for example, package substrate vias 474. Electrical traces may be provided on or within the package substrate to couple the top substrate contact pads to the bottom substrate contact pads.

An underfill 428 may be provided between the interposer and package substrate, as shown in, for example, FIG. 4c. Alternatively, no underfill is provided between the interposer and package substrate, as shown in FIGS. 4a-4b. Other configurations of the underfill and interposer as well as underfill between the dies and interposer may also be useful.

Figure 5A:
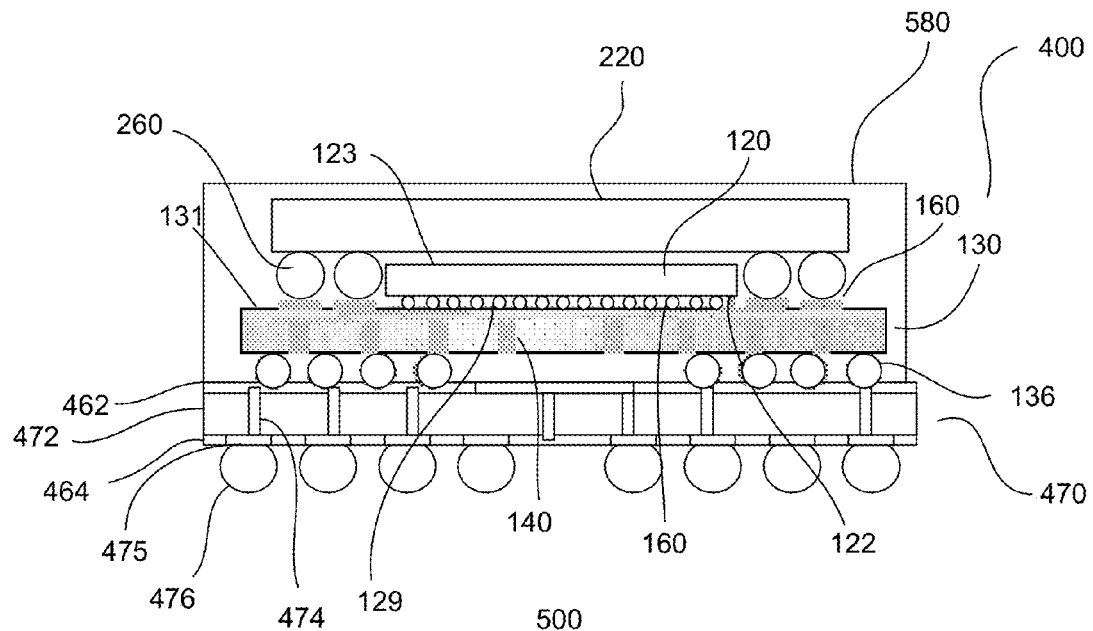
FIGS. 5a-5c show embodiments of other semiconductor packages.
Figure 5B:
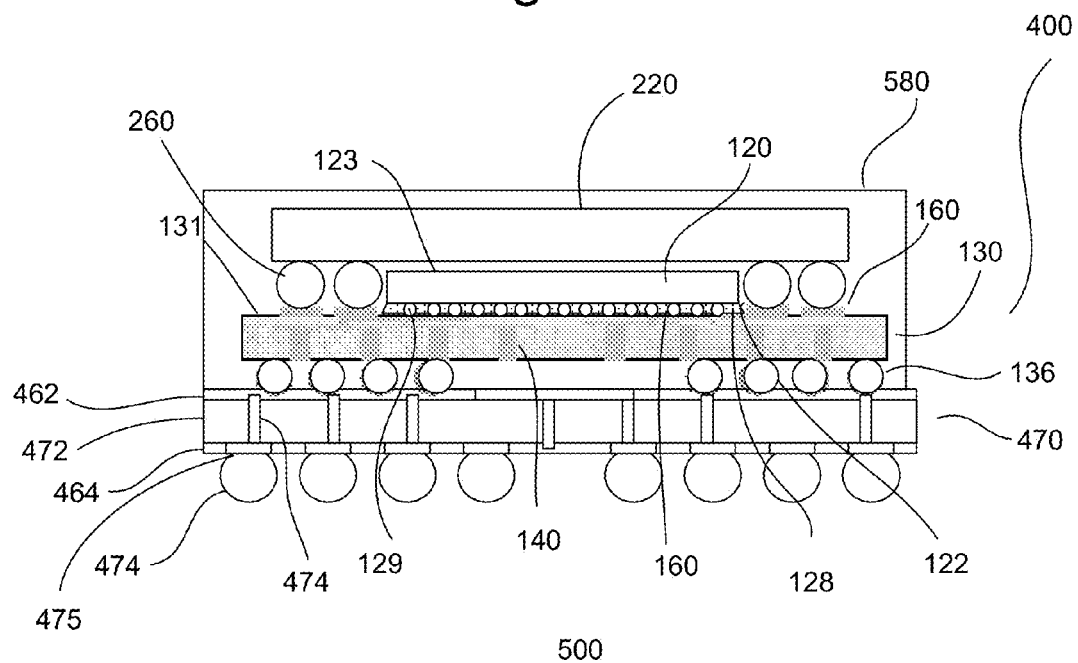
Figure 5C:
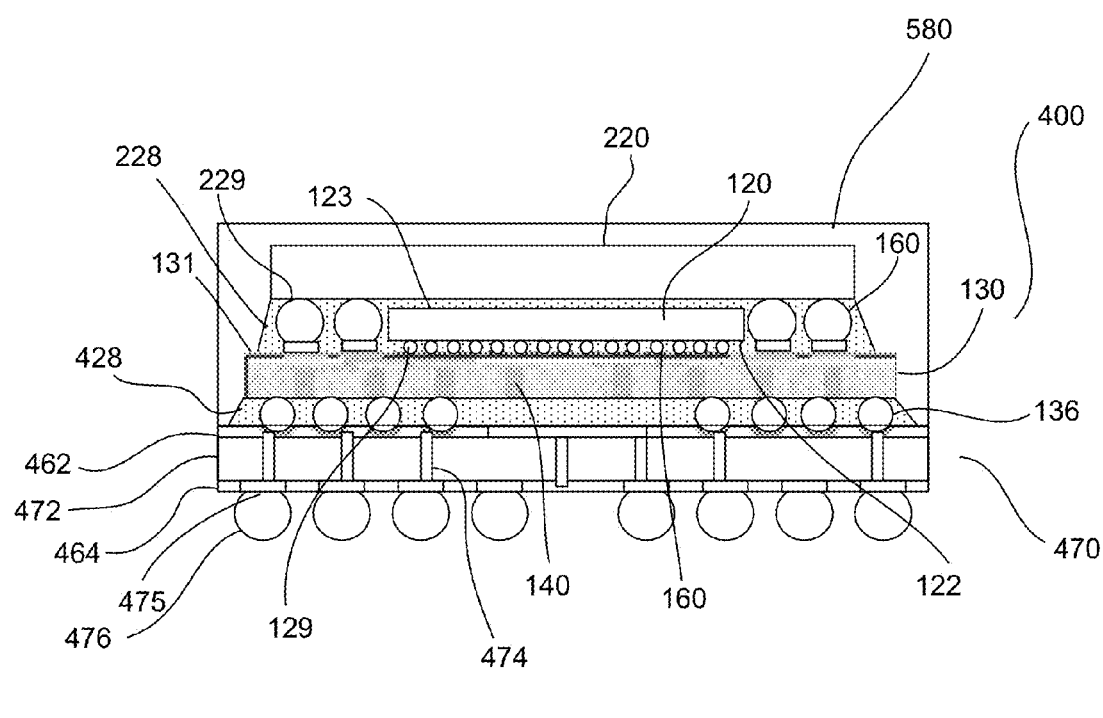

FIGS. 5a-5c show other embodiments of a package 500. The package, in one embodiment, is similar to package 400 described in FIGS. 4a-4c. As such, common features may not be described or described in detail.

Referring to FIGS. 5a-5c, the semiconductor assembly includes an encapsulant 580 which encapsulates package 400 comprising the dies 120 and 220 and interposer 130. For example, the encapsulant material may be an epoxy resin, silicone, or plastic. Other types of encapsulants may also be useful. For example, the encapsulant may be a molding compound. The encapsulant provides protection against the environment. As shown, the encapsulant covers the top of the second die. In other embodiments, the encapsulant may have a coplanar top surface with the surface of the top die (not shown). For example, the inactive surface of the top die is exposed.

FIGS. 6a-6d show an embodiment of a process 600 for forming a semiconductor assembly 100. The process includes providing an interposer 130 having, for example, top and bottom surfaces 131 and 132. A first die attach region 137 is defined on the top surface on which a first die is mounted.

In one embodiment, the interposer is provided as part of an interposer substrate 630 prepared with an plurality of interposers $130_{1-n}$. For illustrative purposes, the substrate includes 3 interposers $130_{1-3}$ (e.g., n=3). However, it is understood that the interposer substrate may be prepared with other number of interposers. The number of interposers may be a semiconductor wafer, such as a silicon wafer. Other types of substrates may also be useful.

The top and bottom surfaces of the interposer are prepared with interposer contact pads 160, including solder lands for example. Additional external interposer contacts 136 are disposed onto the contact pads, which may be in the form of, but not limited to spherical shaped structures, balls or elongated structures. The interposer substrate is further provided with through interposer vias 140 facilitating electrical coupling between the top and bottom interposer contact pads, and conductive traces allowing for re-routing of contact pads to a desirable pattern arrangement.

Figure 6A:
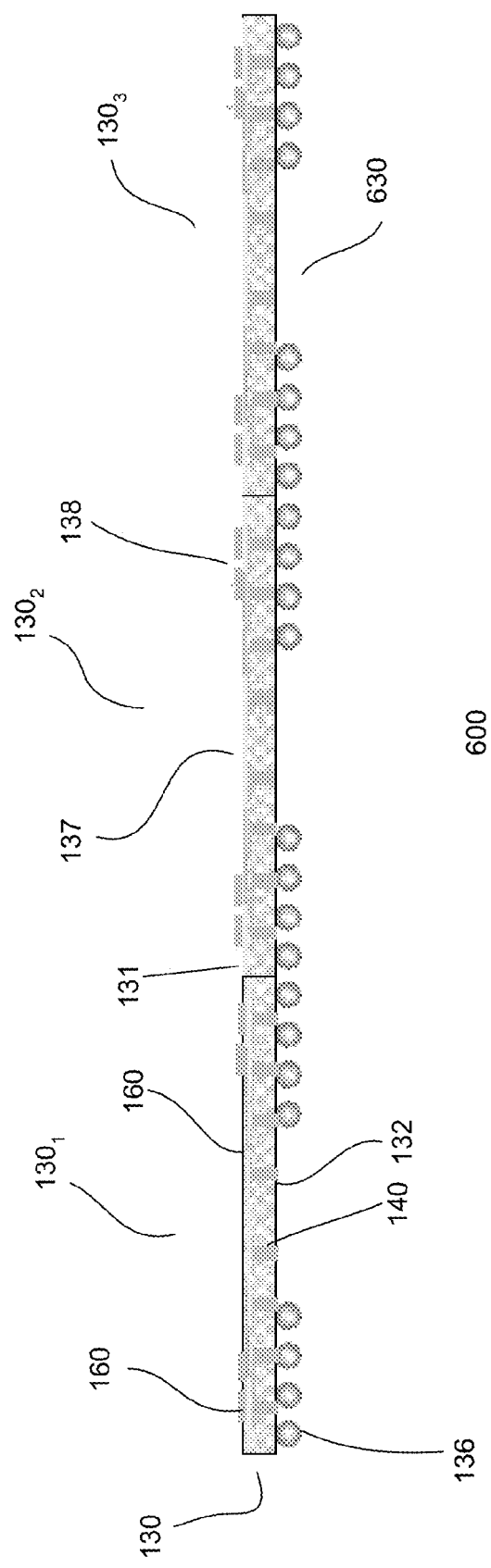
Figure 6B:
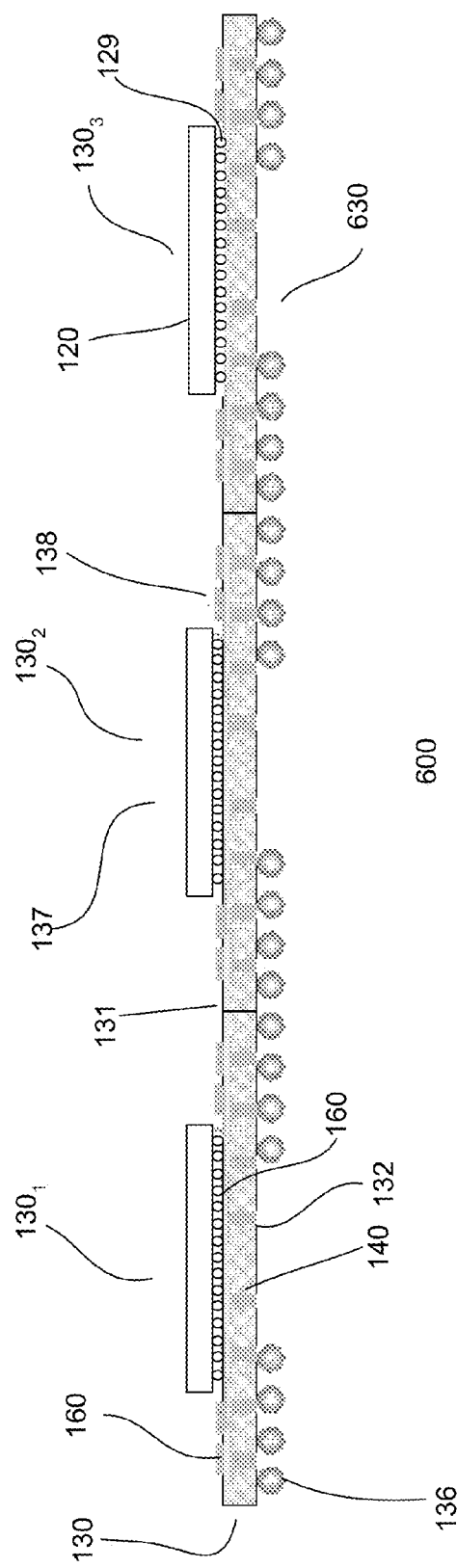

Referring to FIG. 6b, a first die is attached to the die attach region. The die, for example, is a flip chip provided with external die contacts 129 disposed on an active surface. In one embodiment, the die contacts, are mated to the top interposer contacts in the die attach region, with the active surface of the die facing the top surface of the interposer. For example, the die is picked up using a pick-and-place machine, dipped into flux such that the external die contacts 129 are at least partially coated with flux and then attached onto the die attach region.

After the dies are attached to the die attach regions of the interposers, a reflow process is performed, forming connections between the dies ands interposers. Depending on the type of flux used, a clean process may be performed to remove the flux.

In FIG. 6c, an underfill 128 is dispensed into the space between the first die and the top interposer surface. Any suitable type of underfill may be used, including but not limited to capillary underfill, no-flow underfill, molded underfill for example. The underfill, for example, may be an epoxy-based polymeric material. The underfill may be partially or fully cured before the next process. In other embodiments, the step shown in FIG. 6c is skipped, resulting in an interposer package without underfill between the first die and interposer, as shown in FIG. 1a.

Referring to FIG. 6d, a singulation process (as indicated by dotted line 655) is performed on the interposer substrate with attached dies. The singulation process separates the interposers of the interposer substrate into individual semiconductor assemblies, such as semiconductor assembly 100 as shown in FIG. 1b. In one embodiment, the singulation process includes sawing. Other types of singulation processes may also be useful.

Figure 7B:
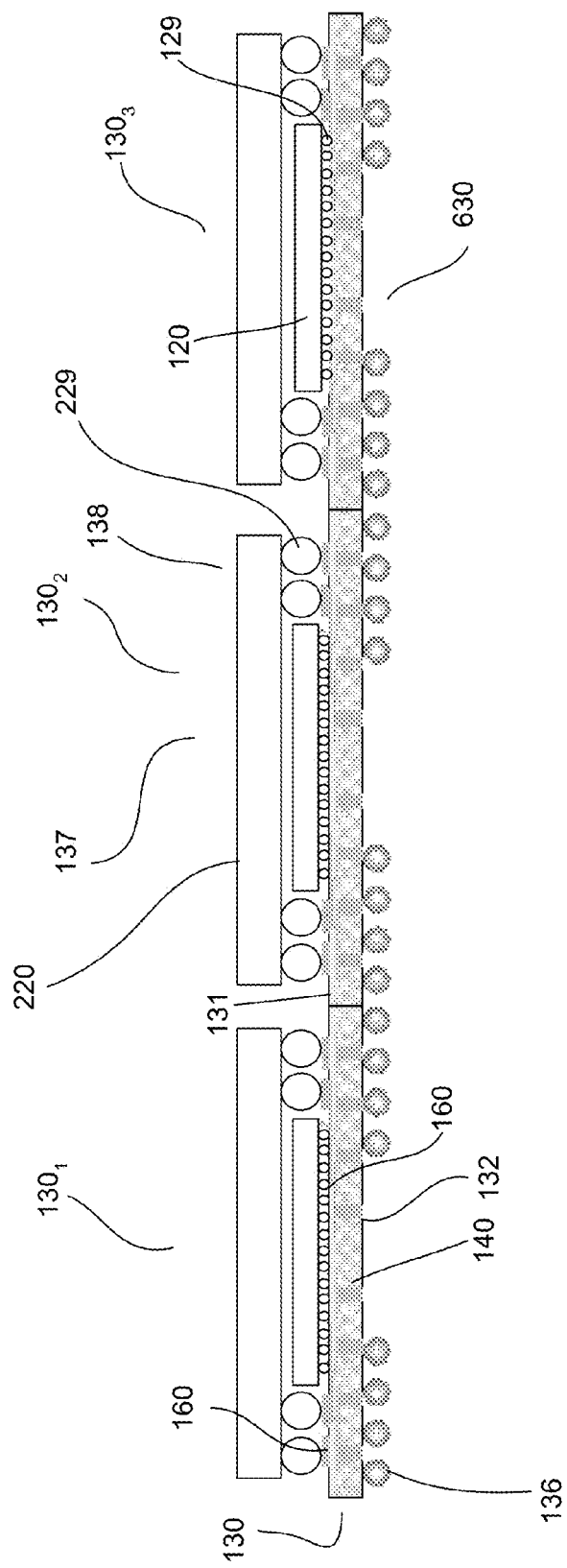

FIGS. 7a-7d show another embodiment of a process 700 for forming a semiconductor assembly 200. Referring to FIG. 7a, an interposer substrate 630 is shown at the stage of processing, for example, as described in FIG. 6b. As such, common elements need not be further described in detail. As shown, the interposer substrate includes a plurality of interposers 1301-n. A first die 120 is mounted onto the first die attach region 137 of the interposers. The interposers also include a second die attach region 138 with interposer contact pads 160 on the top surface. The second die attach region, for example, is disposed on the periphery of the first die attach region.

Referring to FIG. 7b, a second die 220 is mounted on the top interposer surface. The second die, for example, is a flip chip having external die contacts 229 on an active surface. As shown, the surface area of the second die is larger than that of the first die. The second die contacts, for example, are arranged in the periphery of the active surface of the second die to provide a space to accommodate the first die below. The second die contacts are coupled to top interposer contact pads in the second die attach region.

After the dies are attached to the die attach regions of the interposers, a reflow process is performed to establish the connections between the two dies to the interposer. Alternatively, a reflow process may be carried out after the attachment of the first die and another reflow process carried out after the attachment of the second die.

Figure 7C:
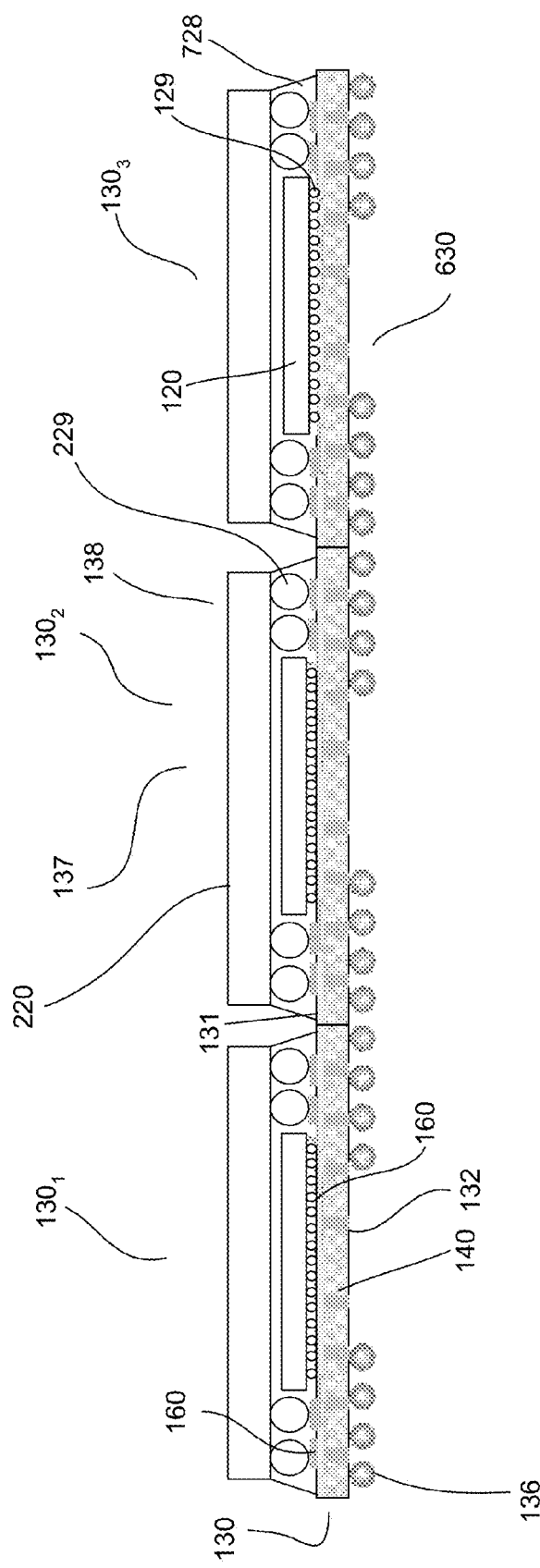
Figure 7D:
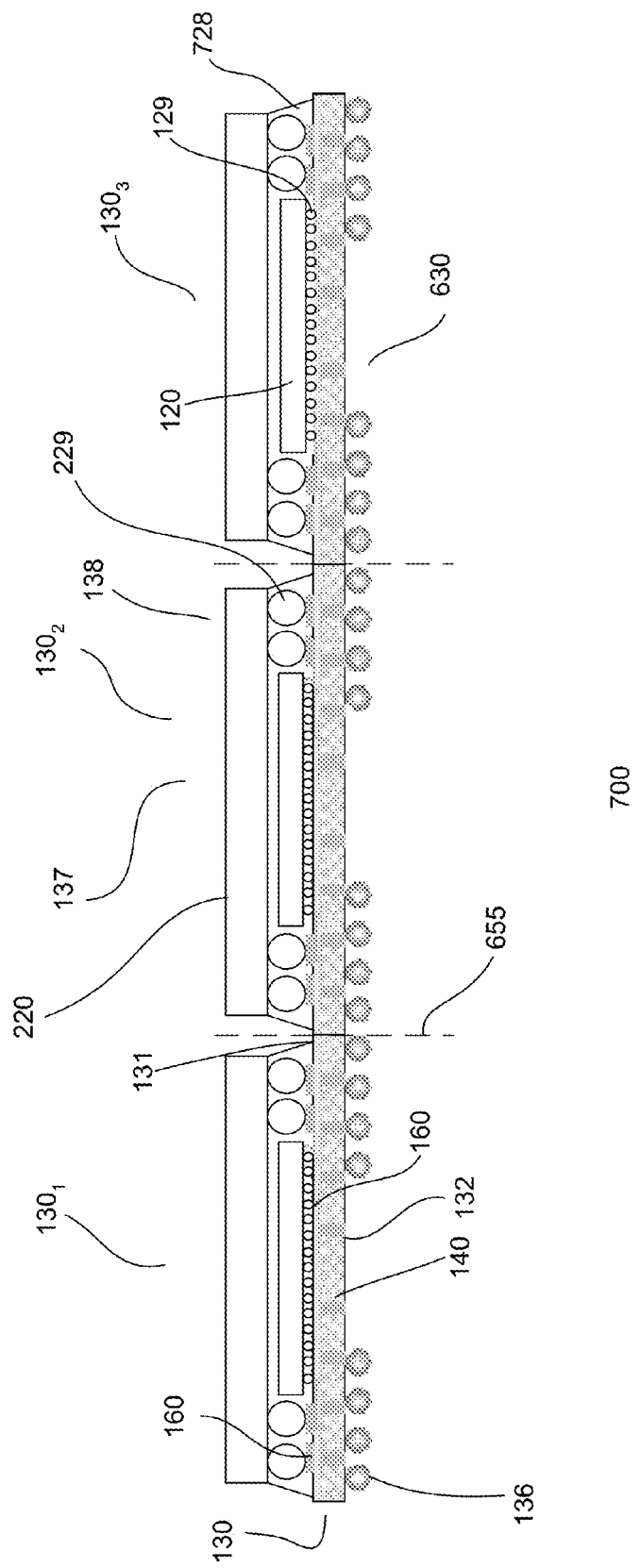

In FIG. 7c, an underfill 728 is dispensed into the space between the first and second dies and the top interposer surface. Alternatively, the first die 120 may be separately underfilled before attaching and underfilling second die 220. Any suitable type of underfill may be used, as aforementioned. The underfill, for example, may be an epoxy-based polymeric material Referring to FIG. 7d, a singulation process (as indicated by dotted line 655) is performed on the interposer substrate with attached dies. The singulation process separates the interposers of the interposer substrate into individual semiconductor assemblies, such as semiconductor assembly 200 shown in FIG. 2a. In one embodiment, the singulation process includes sawing. Other types of singulation processes may also be useful.

In other embodiments, prior to singulation, an encapsulant is formed on the interposer encapsulating the dies. In one embodiment, the encapsulant covers the second dies. In other embodiment, the encapsulant may be coplanar with the top surface of the second dies.

FIGS. 8a-8g show another embodiment of a process 800 for forming a package. The process includes providing a package substrate 470. The package substrate serves as a base of a package for a semiconductor assembly. The package substrate is similar to that described in FIGS. 4a-4c.

In one embodiment, the package base is provided as part of a package substrate 470 prepared with a plurality of package substrate $470_{1-n}$. For illustrative purposes, the package substrate includes 3 package substrates $470_{1-3}$ (e.g., n=3). However, it is understood that the package substrate may be prepared with other number of package substrates. The number of package substrates may depend on the size of the substrate. The package substrates, for example, may be arranged in a strip format or an array format. Arranging the package substrates in other formats may also be useful.

As shown, the bottom surface of the package substrates is prepared with bottom substrate contact pads 475. The bottom substrate contact pads, for example, are conductive pads on which bottom substrate contacts are formed. On the top surface of the package substrate are disposed top substrate contact pads, arranged in a suitable pad pattern for connection to a semiconductor assembly.

Figure 8A:
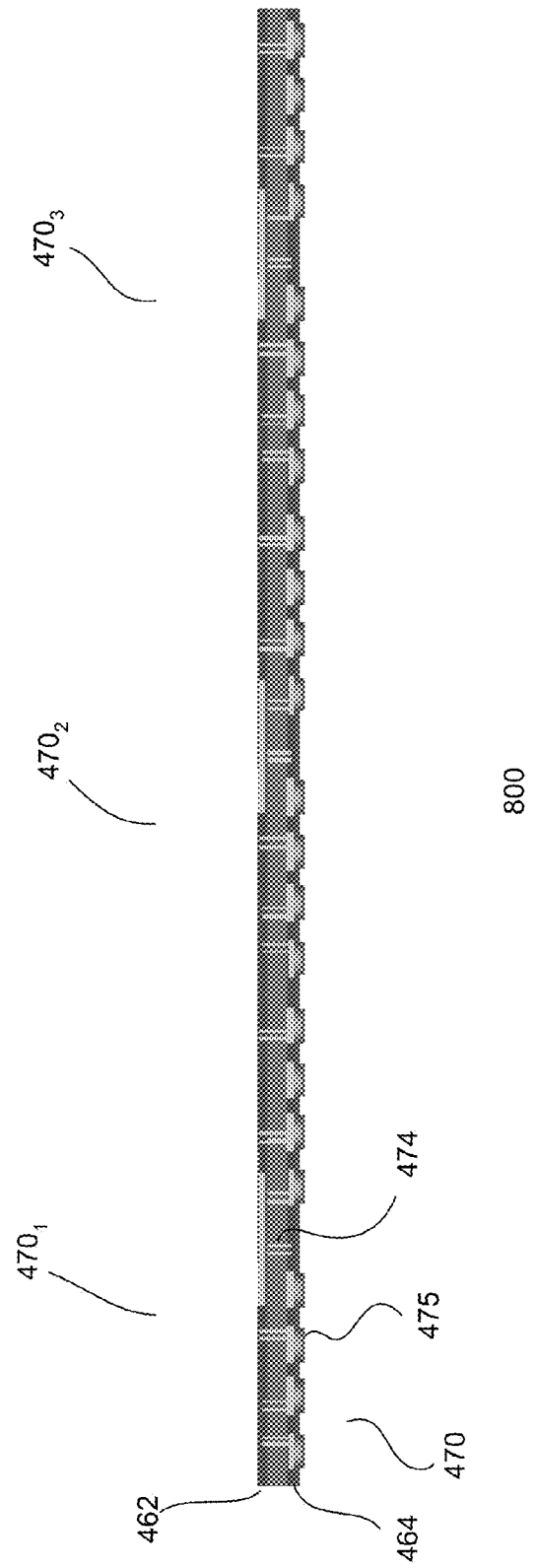
FIGS. 8a-8g show yet another embodiment of a method for forming a semiconductor package.
Figure 8B:
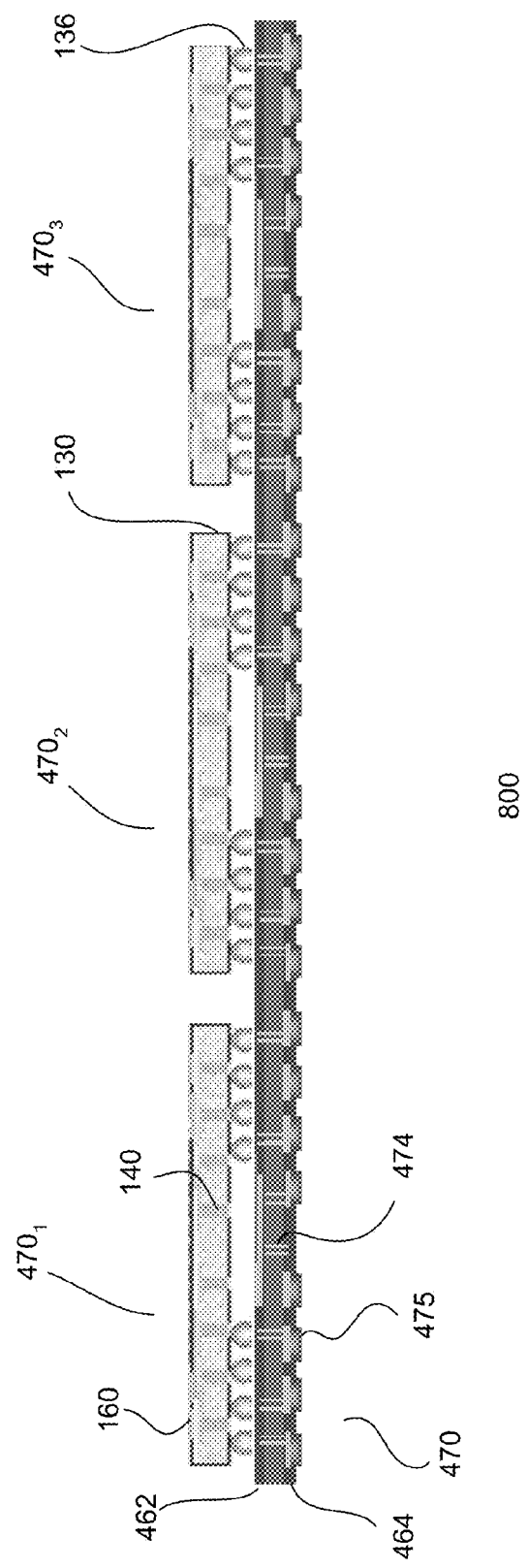

Referring to FIG. 8b, package interposers 130 are provided. The interposers are attached to the top surface of the package substrate. For example, interposers are attached to the top substrate contact pad regions of the package substrate. The interposer contacts 136 contact the top package substrate contact pads. For example, the interposer is picked up using a pick-and-place machine, dipped into flux such that the interposer contacts 136 are at least partially coated with flux and then attached onto the top substrate contact pad region.

Figure 8C:
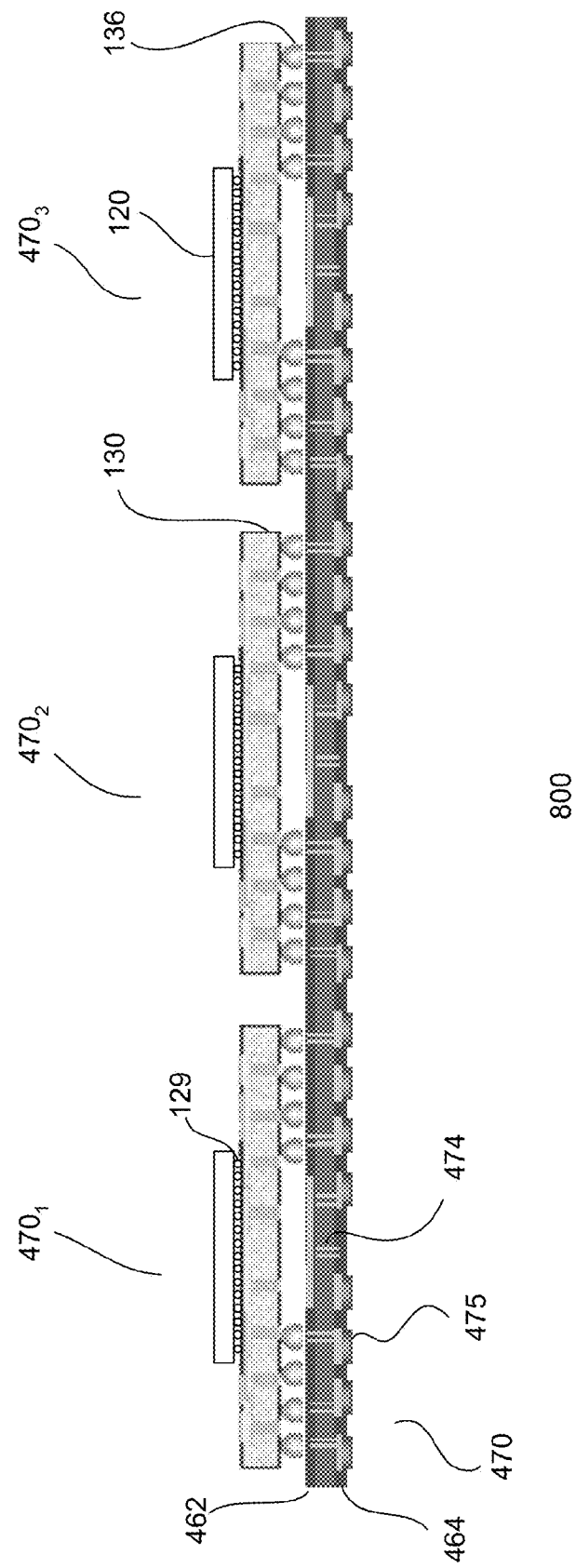

As shown in FIG. 8c, first dies are attached to first die attach regions of the interposers by a suitable die attach process. A reflow process may then be performed, establishing the connections between the dies and interposers. Depending on the die attach process, a flux clean process may also be performed to remove the flux.

Figure 8D:
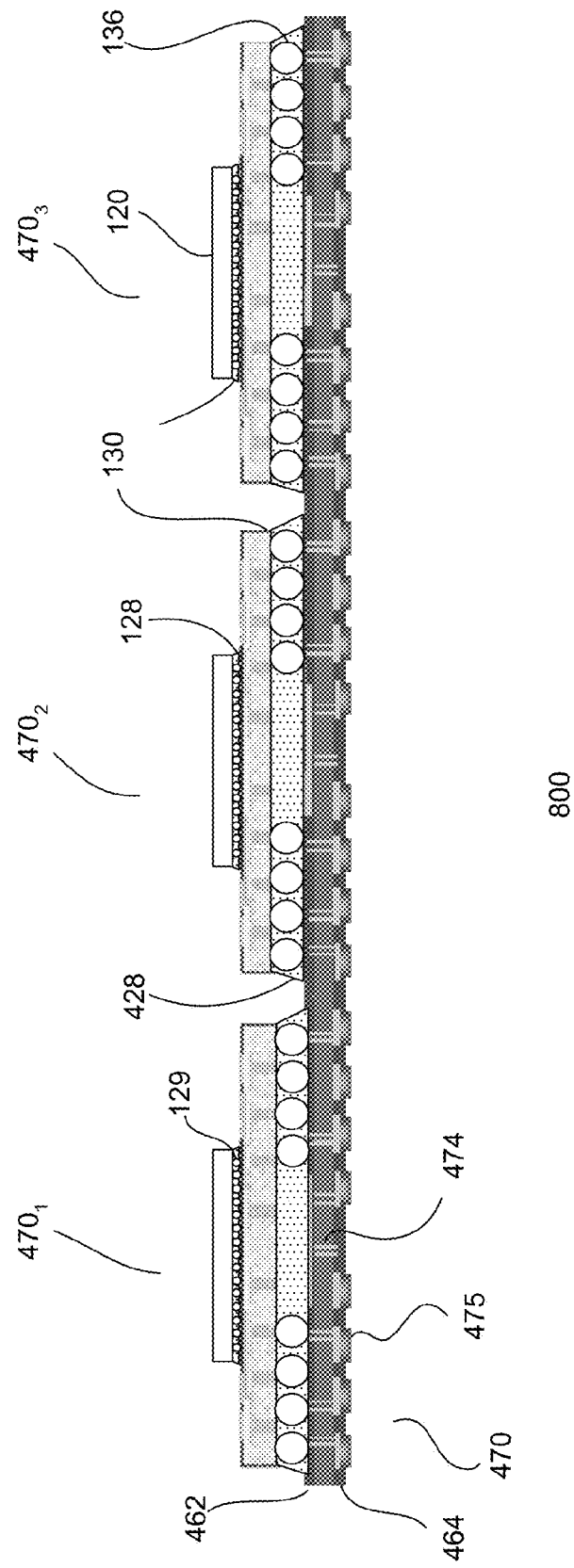

As shown in FIG. 8d, an underfill 128 is dispensed into the space between the first die and the top interposer surface. An underfill 428 is also dispensed into the space between the interposer and package substrate. It is also possible that this step may be skipped, resulting in a package having no underfill between the first dies and interposers and no underfill between the interposers and the package substrate. Alternatively, underfill may be provided in either the space between the interposers and the base substrate or between the dies and the interposers.

Figure 8E:
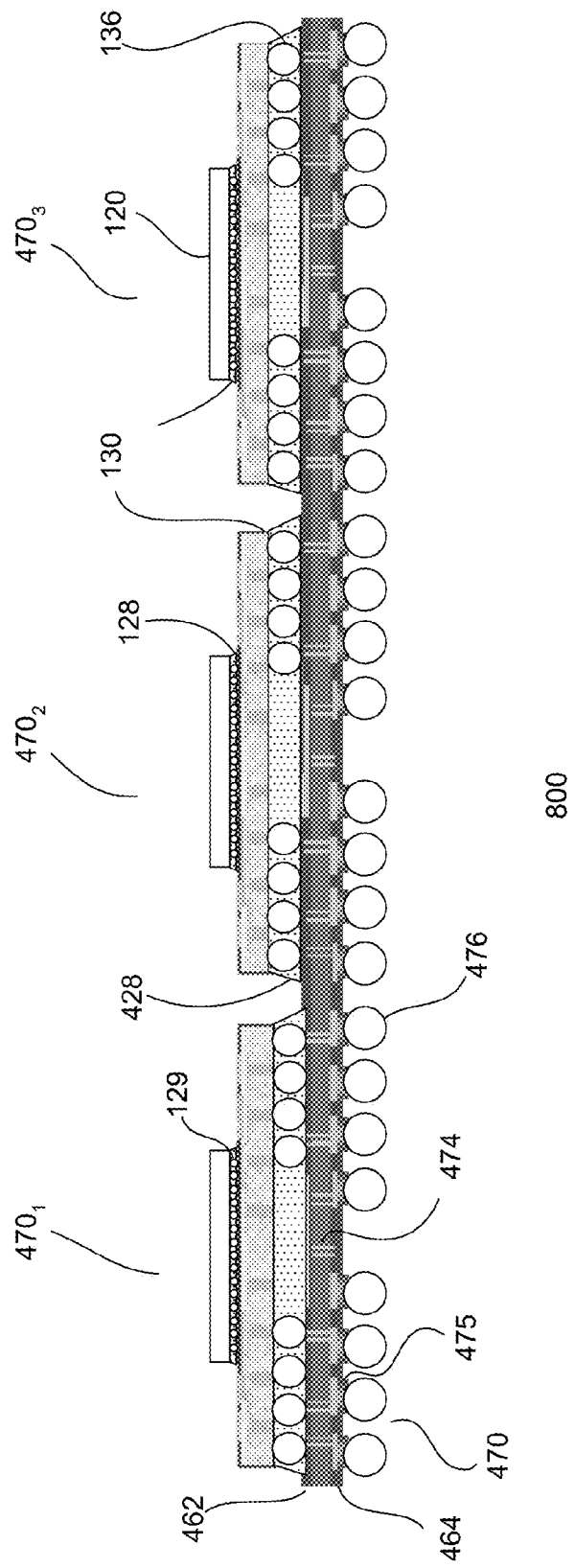
Figure 8F:
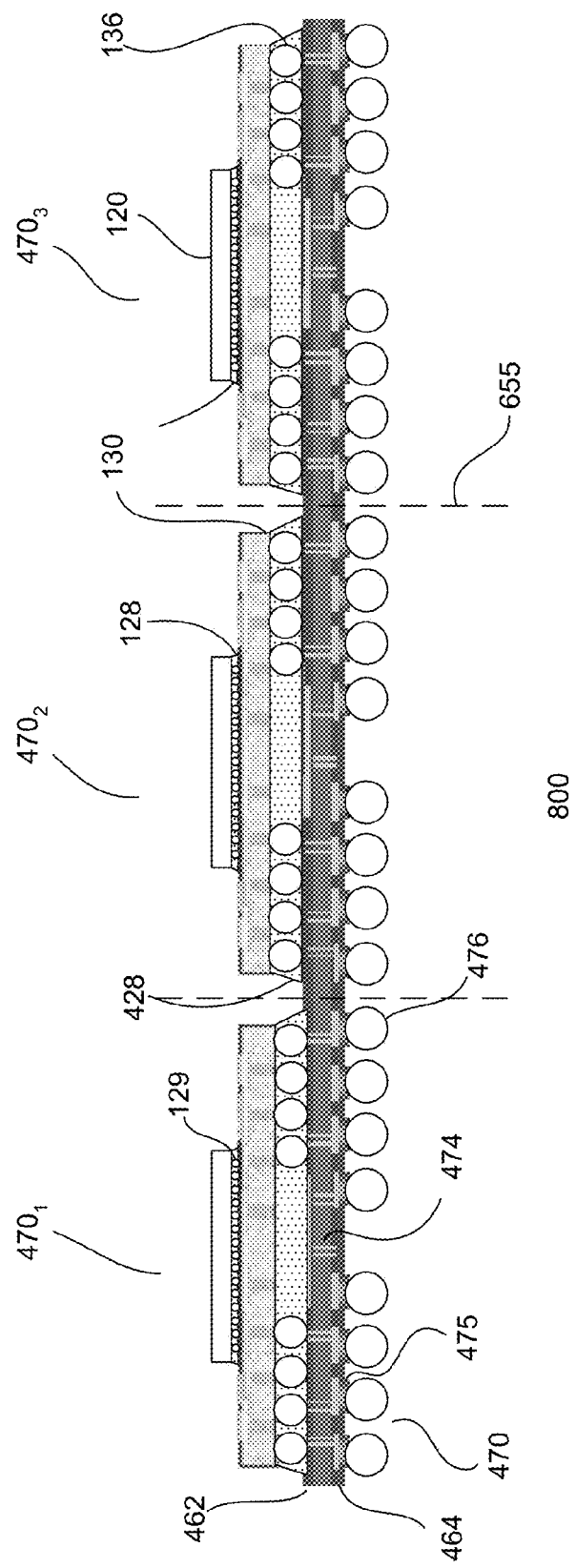

In FIG. 8e, external substrate contacts 476 are provided on the bottom surface of the package substrate. Referring to FIG. 8f, a singulation process is performed on the package substrate. The singulation process separates the package substrates having semiconductor assemblies into individual packages.

In other embodiments, prior to forming external substrate contacts on the package substrate, an encapsulant is formed on the package substrate, encapsulating the first dies and interposers. In one embodiment, the encapsulant covers the dies. In other embodiment, the encapsulant may be coplanar with the top surface of the dies. The encapsulant may fill the spaces between the dies and top surface of the interposer where no underfill is provided.

Figure 8G:
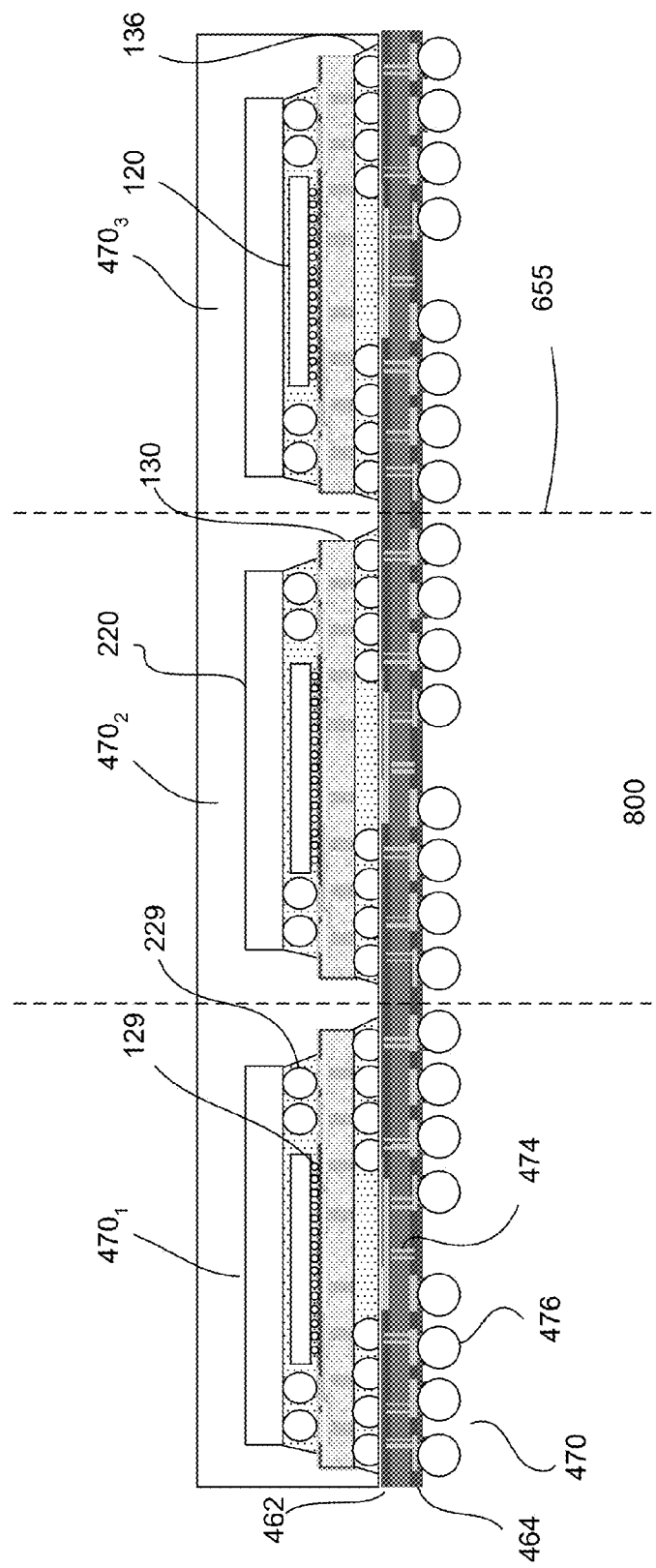

In yet another embodiment, as shown in FIG. 8g, external substrate contacts are formed on the package substrate with the encapsulated dies and interposers, followed by a singulation process to form individual encapsulated packages.

Figure 9A:
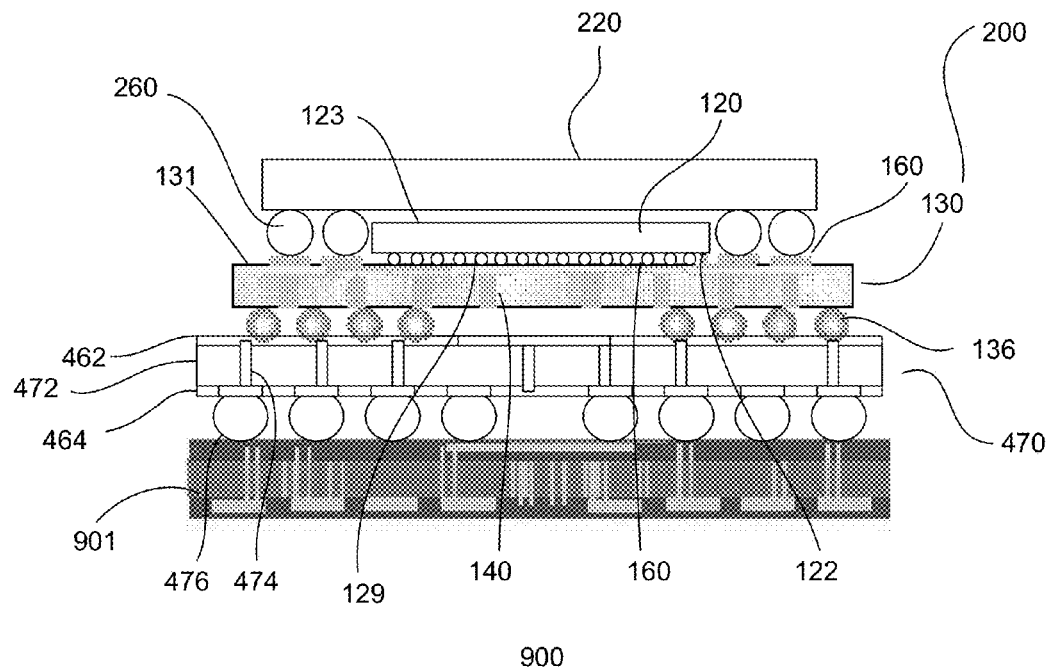
FIGS. 9a-9c show yet other embodiments of semiconductor packages.
Figure 9B:
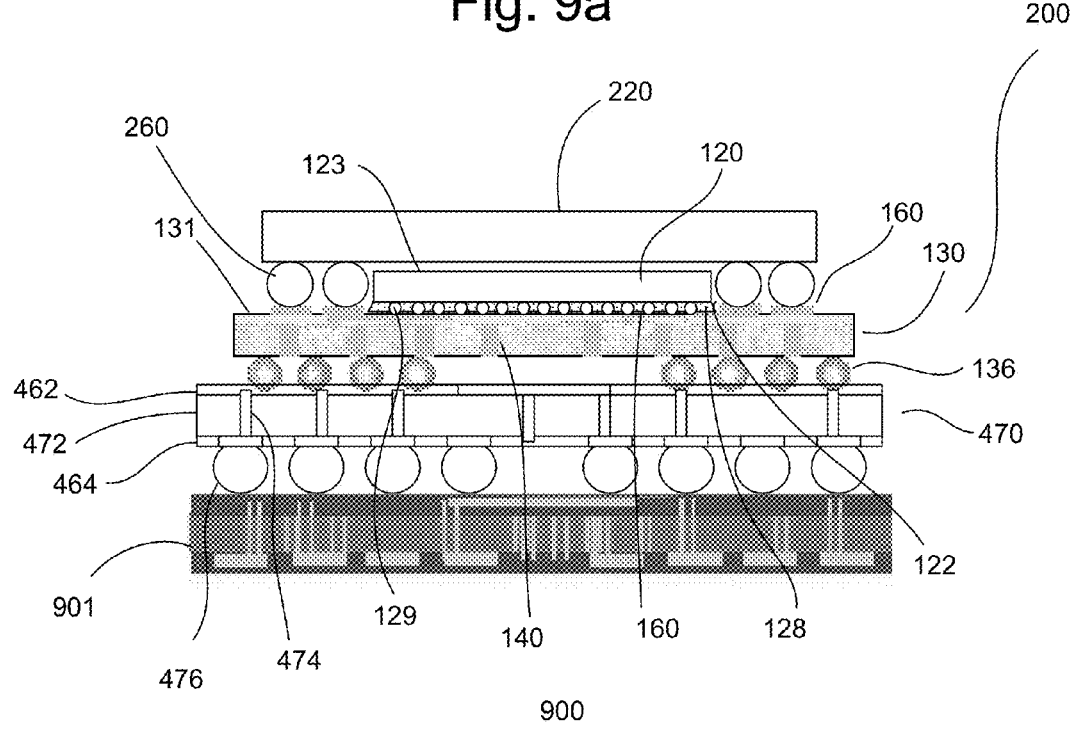
Figure 9C:
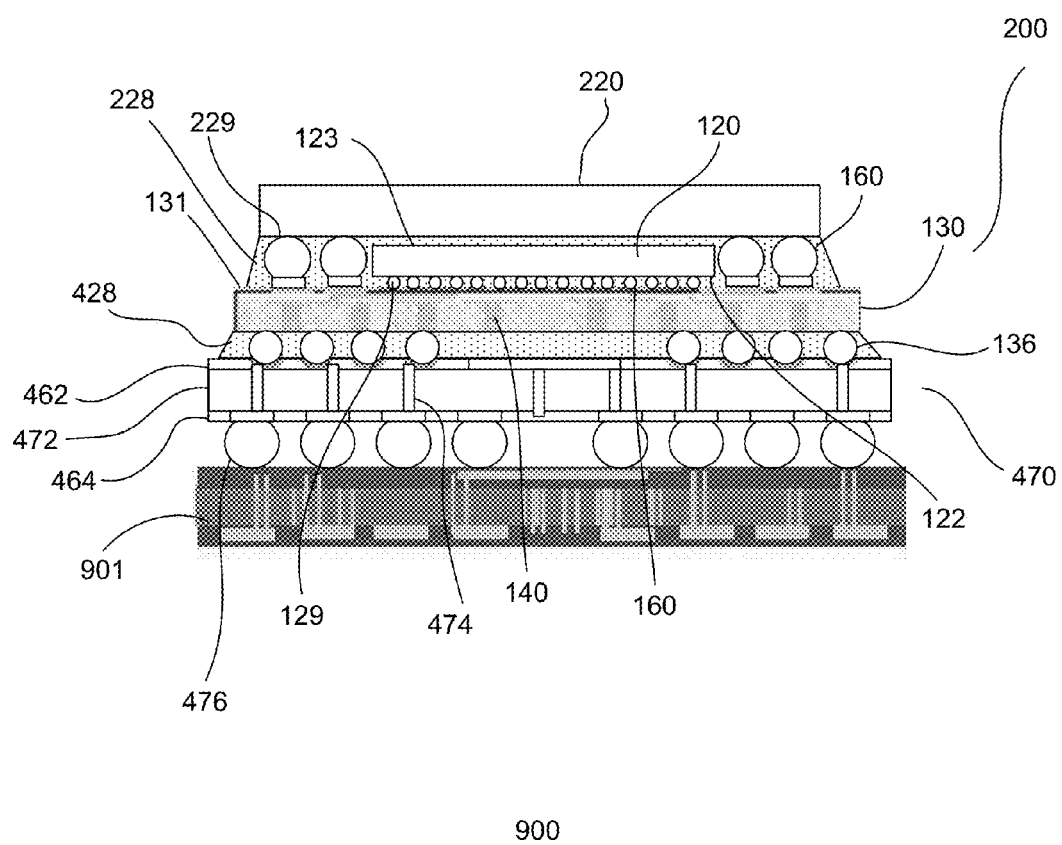

FIGS. 9a-9c show other embodiments of a semiconductor assembly 900. The semiconductor assembly, in one embodiment, is a package coupled to an external component. For example, the package is similar to package 400 or 500 and the external component may be a circuit board 901.

Referring to FIG. 9a, the package is provided without underfill between the dies and top interposer surface. Alternatively, the package may be provided with an underfill between the first die and top interposer surface, as shown in FIG. 9b or between the dies and top interposer surface, as shown in FIG. 9c.

Figure 10A:
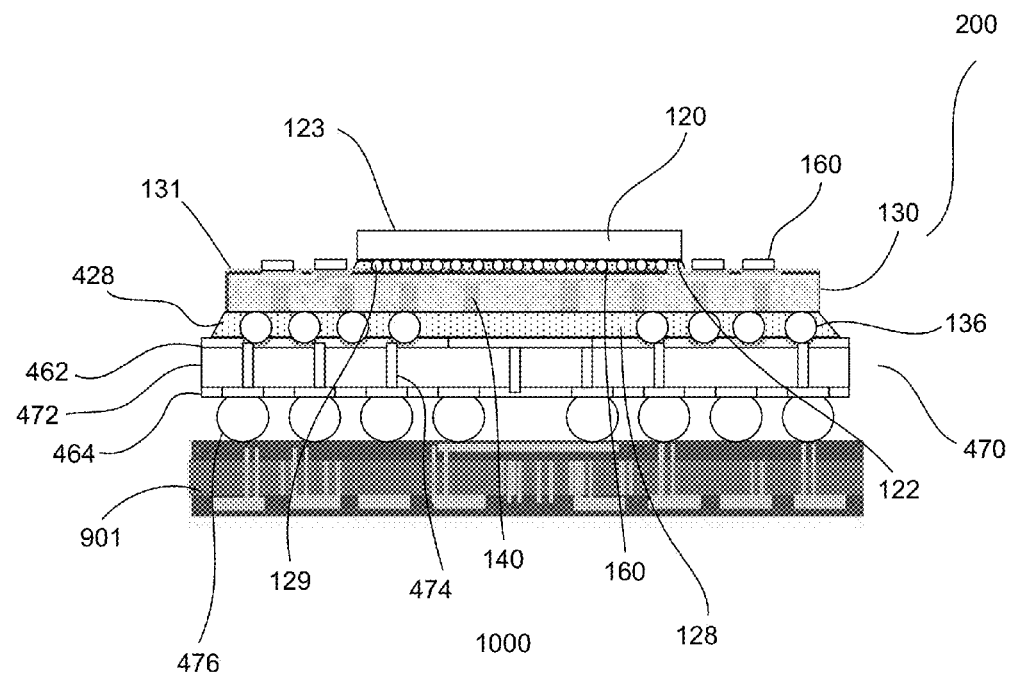
FIGS. 10a-10b illustrate yet another embodiment of a method for forming a semiconductor package.
Figure 10B:
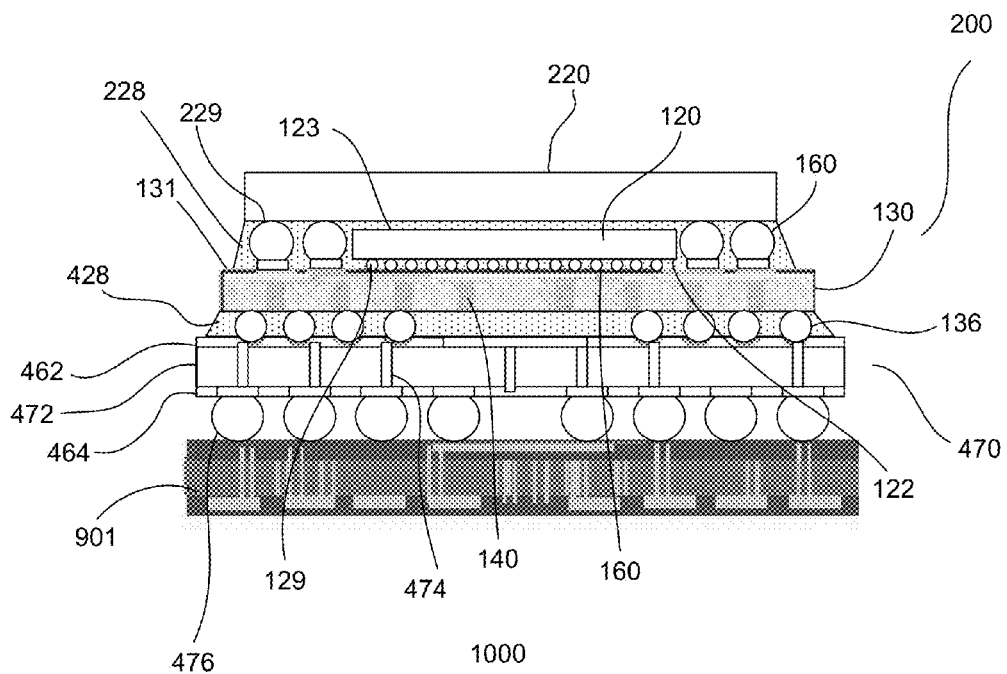

FIGS. 10a-10b illustrate one embodiment of a process 1000 for forming a semiconductor assembly 900. Referring to FIG. 10a, a singulated semiconductor assembly unit obtained from a singulation process as described in, for example, FIG. 8f is coupled to an external component, such as a circuit board 901. The singulated semiconductor assembly unit comprises an interposer 130 with first dies 120 mounted on top being coupled to a package substrate 470. As such, common elements may not be described or described in detail. The package substrate 470 is attached to the top surface of the circuit board 901.

As shown in FIG. 10b, a second die 220 is mounted on the top interposer surface. The second die contacts are coupled to top interposer contacts in the second die attach region. One or more reflow processes may be performed to establish connections between the dies and interposer and between the interposer and circuit board. Flux cleaning processes may also be employed as necessary. Underfill material may be provided as desired in the spaces between for example, the dies, interposer surface, package substrate surface etc. as aforementioned in FIGS. 9a-9c.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming semiconductor assemblies comprising:
   providing an interposer with through interposer vias, the interposer comprises a first surface and a second surface, wherein
      the through interposer vias extend from the first surface to the second surface of the interposer,
      the first and second surfaces of the interposer comprise interposer contact pads thereon, the through interposer vias facilitate electrical coupling between the interposer contact pads on the first and second surfaces of the interposer, and
      the second surface of the interposer comprises interposer contacts disposed thereon, the interposer contacts are configured to facilitate electrical coupling between the interposer contact pads and an external device; and
   mounting a first die on a first die attach region on the first surface of the interposer, the first die comprises a first surface with first conductive contacts thereon, wherein the interposer comprises material with coefficient of thermal expansion (CTE) similar to that of the first die, the first conductive contacts of the first die are coupled to the through interposer vias on the first surface of the interposer.

2. The method in claim 1 comprises performing a reflow process to form connections between the first die and interposer.

3. The method in claim 1 comprises dispensing an underfill into a space between the first die and the first surface of the interposer.

4. The method in claim 1 comprises mounting a second die on a second die attach region on the first surface of the interposer, the second die attach region is disposed on a periphery of the first die attach region.

5. The method in claim 4 comprises performing a reflow process to form connections between the first and second dies and interposer.

6. The method in claim 4 comprises dispensing an underfill into a space between the first and second dies and the first surface of the interposer.

7. The method in claim 4 comprising forming an encapsulant on the interposer, wherein the encapsulant encapsulates the first and second dies.

8. The method in claim 1 comprises forming an encapsulant on the interposer, wherein the encapsulant encapsulates the first die.

9. The method in claim 1 comprises providing a package substrate having first and second surfaces, the first surface of the package substrate comprises first substrate contact pads, wherein the first substrate contact pads contact the interposer contacts on the second surface of the interposer.

10. The method in claim 9 comprises forming external substrate contacts on the second surface of the package substrate, the external substrate contacts serve as external package connections.

11. The method in claim 9 comprising forming an encapsulant on the package substrate, wherein the encapsulant encapsulates the first and second dies and the interposer.

12. A semiconductor assembly comprises:
   an interposer with through interposer vias, the interposer comprises a first surface and a second surface, wherein
      the through interposer vias extend from the first surface to the second surface of the interposer,
      the first and second surfaces of the interposer comprise interposer contact pads thereon, the through interposer vias facilitate electrical coupling between the interposer contact pads on the first and second surfaces of the interposer, and
      the second surface of the interposer comprises interposer contacts disposed thereon, the interposer contacts are configured to facilitate electrical coupling between the interposer contact pads and an external device; and
   a first die on a first die attach region on the first surface of the interposer, the first die comprises a first surface with first conductive contacts thereon, wherein the interposer comprises material with CTE similar to that of the first die, the first conductive contacts of the first die are coupled to the through interposer vias on the first surface of the interposer.

13. The semiconductor assembly in claim 12 comprises an underfill in a space between the first die and the first surface of the interposer.

14. The semiconductor assembly in claim 12 comprising an encapsulant disposed on the interposer, wherein the encapsulant encapsulates the first die.

15. The semiconductor assembly in claim 12 comprising a second die on a second die attach region on the first surface of the interposer, the second die attach region is disposed on a periphery of the first die attach region.

16. The semiconductor assembly in claim 15 comprising an underfill disposed in a space between the first and second dies and the first surface of the interposer.

17. The semiconductor assembly in claim 15 comprising an encapsulant disposed on the interposer, wherein the encapsulant encapsulates the first and second dies.

18. The semiconductor assembly of claim 12 comprising a package substrate having first and second surfaces, the first surface of the package substrate comprises first substrate contact pads, wherein the first substrate contact pads contact the interposer contacts on the second surface of the interposer.

19. The semiconductor assembly of claim 18 comprising external substrate contacts on the second surface of the package substrate, the external substrate contacts serve as external package connections.

20. The semiconductor assembly of claim 19 comprising an encapsulant disposed on the package substrate, wherein the encapsulant encapsulates the first and second dies and the interposer.

* * * * *